United States Patent
Salcedo et al.

(10) Patent No.: US 9,831,233 B2
(45) Date of Patent: Nov. 28, 2017

(54) APPARATUSES FOR COMMUNICATION SYSTEMS TRANSCEIVER INTERFACES

(71) Applicant: Analog Devices Global, Hamilton (BM)

(72) Inventors: Javier Alejandro Salcedo, North Billerica, MA (US); David J. Clarke, Patrickswell (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/142,453

(22) Filed: Apr. 29, 2016

(65) Prior Publication Data
US 2017/0317070 A1 Nov. 2, 2017

(51) Int. Cl.
*H01L 21/02* (2006.01)
*H01L 27/02* (2006.01)
(Continued)

(52) U.S. Cl.
CPC .... *H01L 27/0262* (2013.01); *H01L 23/49541* (2013.01); *H01L 23/528* (2013.01);
(Continued)

(58) Field of Classification Search
CPC ......... H01L 2924/0002; H01L 27/0262; H01L 2924/00; H01L 29/7436; Y10T 29/49117
(Continued)

(56) References Cited

U.S. PATENT DOCUMENTS 3,436,667 A 4/1969 Kedson
4,331,884 A 5/1982 Svedberg
(Continued)

FOREIGN PATENT DOCUMENTS

DE 10 2007 040 875 A1 3/2009
DE 10 2013 101 326 A1 8/2013
(Continued)

OTHER PUBLICATIONS

European Patent Office Search Report for Application No. EP 14 16 7869 dated Oct. 24, 2014, 10 pages.
(Continued)

*Primary Examiner* — Edward Chin
(74) *Attorney, Agent, or Firm* — Knobbe, Martens, Olson & Bear LLP

(57) ABSTRACT

An integrated circuit device for protecting circuits from transient electrical events is disclosed. An integrated circuit device includes a semiconductor substrate having formed therein a bidirectional semiconductor rectifier (SCR) having a cathode/anode electrically connected to a first terminal and an anode/cathode electrically connected to a second terminal. The integrated circuit device additionally includes a plurality of metallization levels formed above the semiconductor substrate. The integrated circuit device further includes a triggering device formed in the semiconductor substrate on a first side and adjacent to the bidirectional SCR. The triggering device includes one or more of a bipolar junction transistor (BJT) or an avalanche PN diode, where a first device terminal of the triggering device is commonly connected to the T1 with the K/A, and where a second device terminal of the triggering device is electrically connected to a central region of the bidirectional SCR through one or more of the metallization levels.

32 Claims, 26 Drawing Sheets

(51) Int. Cl.
| | |
|---|---|
| *H01L 29/06* | (2006.01) |
| *H01L 23/528* | (2006.01) |
| *H01L 23/552* | (2006.01) |
| *H01L 23/522* | (2006.01) |
| *H01L 23/532* | (2006.01) |
| *H01L 29/73* | (2006.01) |
| *H01L 27/06* | (2006.01) |
| *H04B 1/40* | (2015.01) |
| *H01L 25/18* | (2006.01) |
| *H01L 23/495* | (2006.01) |
| *H01L 23/00* | (2006.01) |

(52) U.S. Cl.
CPC .... *H01L 23/5228* (2013.01); *H01L 23/53271* (2013.01); *H01L 23/552* (2013.01); *H01L 24/32* (2013.01); *H01L 24/49* (2013.01); *H01L 24/73* (2013.01); *H01L 25/18* (2013.01); *H01L 27/0255* (2013.01); *H01L 27/0647* (2013.01); *H01L 29/0649* (2013.01); *H01L 29/0684* (2013.01); *H01L 29/73* (2013.01); *H04B 1/40* (2013.01); *H01L 2224/32145* (2013.01); *H01L 2224/48091* (2013.01); *H01L 2224/48101* (2013.01); *H01L 2224/48106* (2013.01); *H01L 2224/48145* (2013.01); *H01L 2224/48247* (2013.01); *H01L 2224/49105* (2013.01); *H01L 2224/49171* (2013.01); *H01L 2224/73265* (2013.01); *H01L 2924/1203* (2013.01); *H01L 2924/1207* (2013.01); *H01L 2924/12036* (2013.01); *H01L 2924/1305* (2013.01); *H01L 2924/13034* (2013.01); *H01L 2924/13091* (2013.01); *H01L 2924/1426* (2013.01); *H01L 2924/3025* (2013.01)

(58) Field of Classification Search
USPC .......... 257/173, E29.225, 175, 360; 438/309
See application file for complete search history.

(56) References Cited

U.S. PATENT DOCUMENTS

| | | | |
|---|---|---|---|
| 4,633,283 A | 12/1986 | Avery | |
| 5,061,652 A | 10/1991 | Bendernagel et al. | |
| 5,182,220 A | 1/1993 | Ker et al. | |
| 5,276,582 A | 1/1994 | Merrill et al. | |
| 5,341,005 A | 8/1994 | Canclini | |
| 5,343,053 A | 8/1994 | Avery | |
| 5,369,041 A | 11/1994 | Duvvury | |
| 5,541,801 A | 7/1996 | Lee et al. | |
| 5,576,557 A | 11/1996 | Ker et al. | |
| 5,615,074 A | 3/1997 | Avery | |
| 5,652,689 A | 7/1997 | Yuan | |
| 5,663,860 A | 9/1997 | Swonger | |
| 5,742,084 A | 4/1998 | Yu | |
| 5,745,323 A | 4/1998 | English et al. | |
| 5,781,389 A | 7/1998 | Fukuzako et al. | |
| 5,786,617 A | 7/1998 | Merrill et al. | |
| 5,889,644 A | 3/1999 | Schoenfeld et al. | |
| 5,895,840 A | 4/1999 | Ohuchi et al. | |
| 5,895,940 A | 4/1999 | Kim | |
| 5,998,813 A | 12/1999 | Bernier | |
| 6,097,068 A | 8/2000 | Brown et al. | |
| 6,104,589 A | 8/2000 | Williamson | |
| 6,137,140 A | 10/2000 | Efland et al. | |
| 6,144,542 A | 11/2000 | Ker et al. | |
| 6,172,403 B1 | 1/2001 | Chen | |
| 6,236,087 B1 | 5/2001 | Daly et al. | |
| 6,258,634 B1 | 7/2001 | Wang et al. | |
| 6,310,379 B1 | 10/2001 | Andresen et al. | |
| 6,329,694 B1 | 12/2001 | Lee et al. | |
| 6,403,992 B1 | 6/2002 | Wei | |
| 6,404,261 B1 | 6/2002 | Grover et al. | |
| 6,423,987 B1 | 7/2002 | Constapel et al. | |
| 6,512,662 B1 | 1/2003 | Wang | |
| 6,538,266 B2 | 3/2003 | Lee et al. | |
| 6,590,273 B2 | 7/2003 | Okawa et al. | |
| 6,621,126 B2 | 9/2003 | Russ | |
| 6,665,160 B2 | 12/2003 | Lin et al. | |
| 6,667,870 B1 | 12/2003 | Segervall | |
| 6,704,180 B2 | 3/2004 | Tyler et al. | |
| 6,724,603 B2 | 4/2004 | Miller et al. | |
| 6,756,834 B1 | 6/2004 | Tong et al. | |
| 6,765,771 B2 | 7/2004 | Ker et al. | |
| 6,768,616 B2 | 7/2004 | Mergens et al. | |
| 6,784,489 B1 | 8/2004 | Menegoli | |
| 6,870,202 B2 | 3/2005 | Oka | |
| 6,960,792 B1 | 11/2005 | Nguyen | |
| 6,960,811 B2 | 11/2005 | Wu et al. | |
| 6,979,869 B2 | 12/2005 | Chen et al. | |
| 7,034,363 B2 | 4/2006 | Chen | |
| 7,038,280 B2 | 5/2006 | Righter | |
| 7,071,528 B2 | 7/2006 | Ker et al. | |
| 7,125,760 B1 | 10/2006 | Reese et al. | |
| 7,232,705 B2 | 6/2007 | Righter | |
| 7,232,711 B2 | 6/2007 | Gambino et al. | |
| 7,335,543 B2 | 2/2008 | Chen et al. | |
| 7,345,341 B2 | 3/2008 | Lin et al. | |
| 7,385,793 B1 | 6/2008 | Ansel et al. | |
| 7,436,640 B2 | 10/2008 | Su et al. | |
| 7,566,914 B2 | 7/2009 | Salcedo et al. | |
| 7,570,467 B2 | 8/2009 | Watanabe et al. | |
| 7,601,991 B2 | 10/2009 | Salcedo et al. | |
| 7,663,190 B2 | 2/2010 | Vinson | |
| 7,714,357 B2 | 5/2010 | Hayashi et al. | |
| 7,834,378 B2 | 11/2010 | Ryu et al. | |
| 7,910,999 B2 | 3/2011 | Lee et al. | |
| 7,969,006 B2 | 6/2011 | Lin et al. | |
| 8,044,457 B2 | 10/2011 | Salcedo et al. | |
| 8,198,651 B2 | 6/2012 | Langguth et al. | |
| 8,217,461 B1 | 7/2012 | Chu et al. | |
| 8,218,276 B2 | 7/2012 | Mallikarjunaswamy | |
| 8,222,698 B2 | 7/2012 | Salcedo et al. | |
| 8,331,069 B2 | 12/2012 | Galy et al. | |
| 8,368,116 B2 | 2/2013 | Salcedo et al. | |
| 8,416,543 B2 | 4/2013 | Salcedo | |
| 8,432,651 B2 | 4/2013 | Salcedo et al. | |
| 8,466,489 B2 | 6/2013 | Salcedo et al. | |
| 8,553,380 B2 | 10/2013 | Salcedo | |
| 8,592,860 B2 | 11/2013 | Salcedo et al. | |
| 8,610,251 B1 | 12/2013 | Salcedo | |
| 8,633,509 B2 | 1/2014 | Salcedo | |
| 8,637,899 B2 | 1/2014 | Salcedo | |
| 8,665,571 B2 | 3/2014 | Salcedo et al. | |
| 8,680,620 B2 | 3/2014 | Salcedo et al. | |
| 8,686,470 B2 | 4/2014 | Ritter | |
| 8,772,091 B2 | 7/2014 | Salcedo et al. | |
| 8,796,729 B2 | 8/2014 | Clarke et al. | |
| 8,829,570 B2 | 9/2014 | Salcedo et al. | |
| 8,860,080 B2 | 10/2014 | Salcedo et al. | |
| 8,890,248 B2 | 11/2014 | Pauletti et al. | |
| 8,946,822 B2 | 2/2015 | Salcedo et al. | |
| 8,947,841 B2 | 2/2015 | Salcedo et al. | |
| 8,963,200 B2 | 2/2015 | Lee et al. | |
| 9,006,781 B2 | 4/2015 | Salcedo et al. | |
| 9,006,782 B2 | 4/2015 | Salcedo | |
| 2001/0040254 A1 | 11/2001 | Takiguchi | |
| 2002/0021538 A1 | 2/2002 | Chen et al. | |
| 2002/0081783 A1 | 6/2002 | Lee et al. | |
| 2002/0109190 A1 | 8/2002 | Ker et al. | |
| 2002/0122280 A1 | 9/2002 | Ker et al. | |
| 2002/0153571 A1 | 10/2002 | Mergens et al. | |
| 2002/0187601 A1 | 12/2002 | Lee et al. | |
| 2003/0038298 A1 | 2/2003 | Cheng et al. | |
| 2003/0076636 A1 | 4/2003 | Ker et al. | |
| 2004/0135229 A1 | 7/2004 | Sasahara | |
| 2004/0164351 A1 | 8/2004 | Petruzzello et al. | |
| 2004/0164354 A1 | 8/2004 | Mergens et al. | |
| 2004/0190208 A1 | 9/2004 | Levit | |
| 2004/0207021 A1 | 10/2004 | Russ et al. | |
| 2004/0240128 A1 | 12/2004 | Boselli et al. | |
| 2005/0012155 A1 | 1/2005 | Ker et al. | |

(56) References Cited

U.S. PATENT DOCUMENTS

| | | |
|---|---|---|
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1* | 8/2005 | Manna ............... H01L 27/0262 257/173 |
| 2005/0195540 A1 | 9/2005 | Streibl et al. |
| 2005/0269641 A1 | 12/2005 | Lai et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0034956 A1 | 2/2007 | Lee et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0205714 A1 | 8/2012 | Salcedo et al. |
| 2012/0211869 A1 | 8/2012 | Lee et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1* | 11/2014 | Salcedo ............... H01L 27/0262 257/173 |
| 2015/0076557 A1 | 3/2015 | Salcedo et al. |
| 2016/0141358 A1 | 5/2016 | Salcedo et al. |
| 2016/0204096 A1 | 7/2016 | Zhao et al. |
| 2016/0300830 A1* | 10/2016 | Salcedo ............... H01L 27/0259 |

FOREIGN PATENT DOCUMENTS

| | | |
|---|---|---|
| EP | 0 168 678 A2 | 1/1986 |
| EP | 0 915 508 A1 | 5/1999 |
| EP | 1 703 560 A2 | 9/2006 |
| JP | 2007-012864 | 1/2007 |
| KR | 10-2005-0098458 A | 10/2005 |
| KR | 10-2006-0067100 | 2/2006 |
| KR | 10-2009-0123683 | 12/2009 |
| KR | 10-2010-0003569 | 1/2010 |
| WO | WO 2012/005936 A1 | 1/2012 |

OTHER PUBLICATIONS

Parthasarathy, S., Salcedo, J.A., Hajjar, J., Analog Devices, Wilmington, MA, USA, Design of SCR Devices for SiGe BiCMOS Applications, Bipolar/BiCMOS Circuits and Technology Meeting (BCTM), 2011 IEEE, p. 235-238.

Anderson et al., ESD Protection under Wire Bonding Pads, EOS/ESD Symposium 99-88, pp. 2A.4.1-2A.4.7 (1999).

Chang et al., High-k Metal Gate-bounded Silicon Controlled Rectifier for ESD Protection, 34th Electrical Overstress/Electrostatic Discharge Symposium, Sep. 2012, 7 pages.

Chia-Tsen Dai, Ming-Dou Ker, IEEE International Conference on Microelectronic Test Structures (ICMTMS), 4 pages, Mar. 2013.

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Petr Betak: "An Advanced SCR Protective Structure Against ESD Stress". Proceedings of the 13th Conference Student EEICT 2007, vol. 4, Jan. 2007, pp. 286-290.

R. Rudolf, C. Wagner, L. O'Riain, K. Gebhardt, B. Kuhn-Heinrich, B. von Ehrenwall, A. von Ehrenwall, M. Strasser, M. Stecher, U. Glaser, S. Aresu, P. Kuepper, A. Mayerhofer, IEEE International Symposium on Power Semiconductor Devices and ICs, 4 pages, May 2011.

Salcedo et al., Bidirectional Devices for Automotive-Grade Electrostatic Discharge Applications, IEEE Electron Device Letters, vol. 33, No. 6, Jun. 2012, 3 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

Xi et al. "Design and Characterization of ESD Solutions with EMC Robustness for Automotive Applications", Microelectronics Reliability 55 (2015) 2236-2246.

European Examination Report dated Sep. 27, 2016 for Application No. 14167969.6 in 6 pages.

Jang, Sheng "Novel diode-chain Triggering SCR circuits for ESD protection" Solid-State Elec. vol. 44, Iss.7 Jul. 1, 2000 pp. 1297-1303.

\* cited by examiner

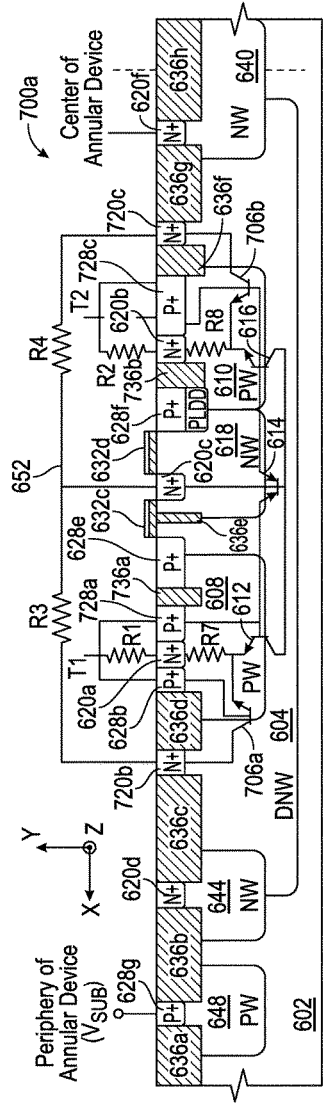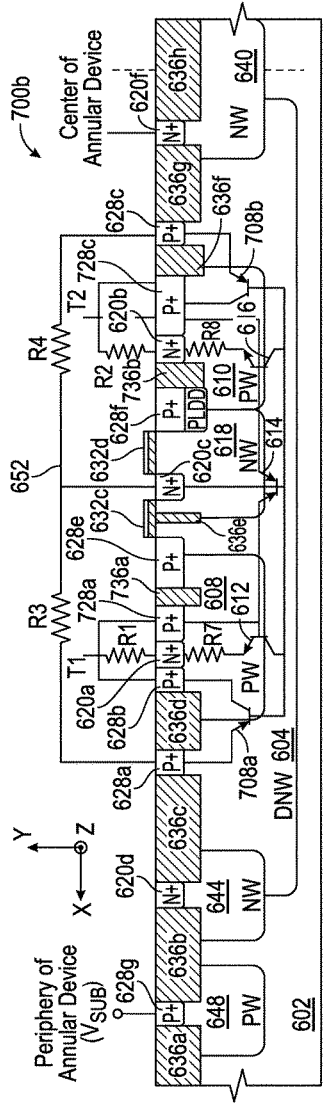
FIG. 7A
FIG. 7B

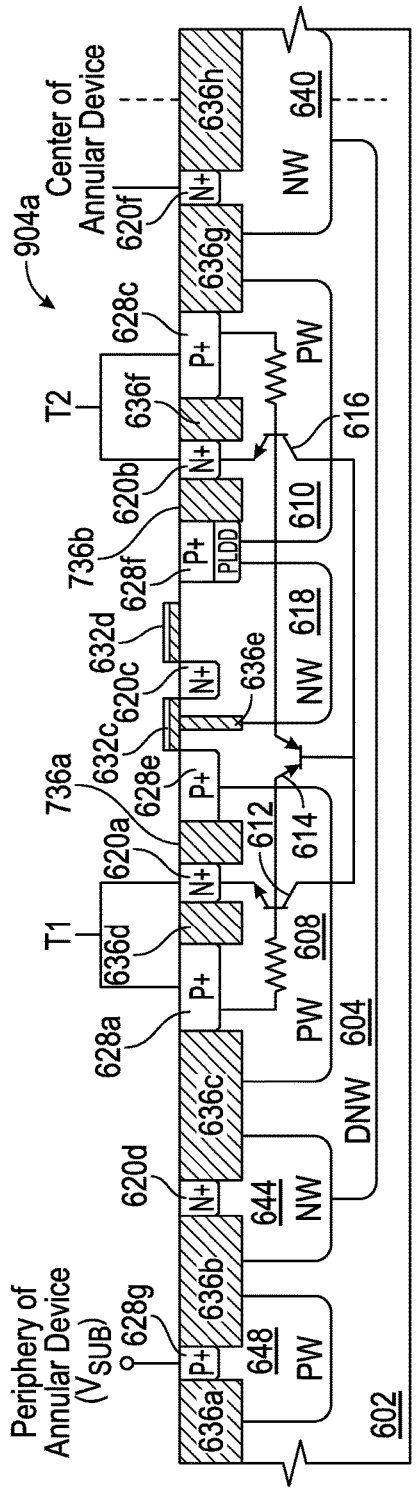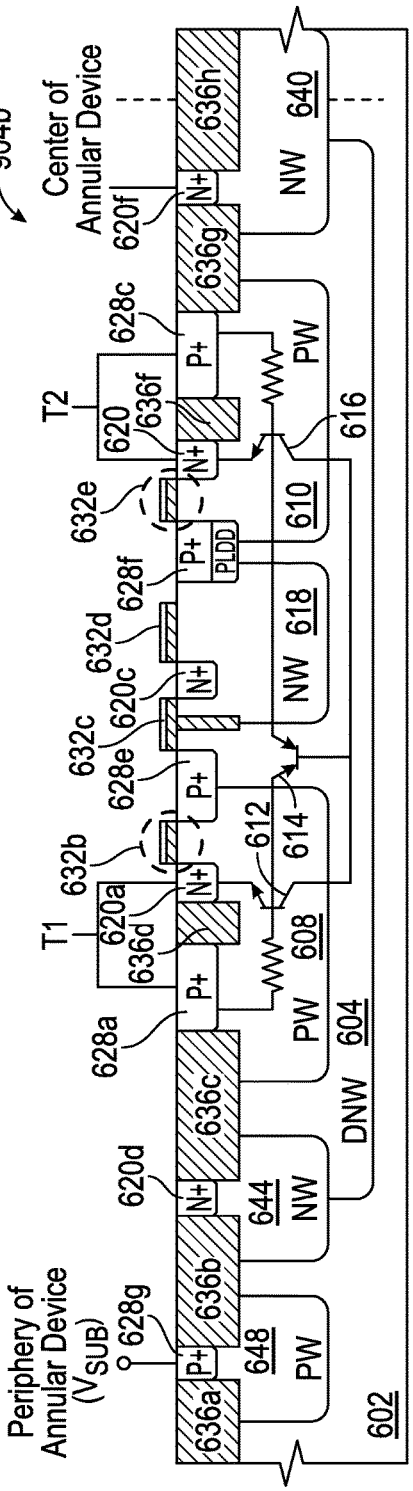
FIG. 9A
FIG. 9B

APPARATUSES FOR COMMUNICATION SYSTEMS TRANSCEIVER INTERFACES

BACKGROUND

Field

The disclosed technology relates to electronics, and more particularly to protection devices for communication systems transceiver interfaces for providing protection from transient electrical events, such as electrical overstress/electrostatic discharge.

Description of the Related Technology

Certain electronic systems can be exposed to transient electrical events that last a relatively short duration and have rapidly changing voltages and/or currents. Transient electrical events can include, for example, electrostatic discharge (ESD) or electromagnetic interference events arising from the abrupt release of charge from an object or person to an electronic system.

Transient electrical events can damage integrated circuits (ICs) inside an electronic system due to overvoltage conditions and/or high levels of power dissipation over relatively small areas of the ICs. This rapid and high dissipation of power can potentially lead to damages to core circuits arising from, e.g., gate oxide punch-through, junction damage, metal damage, and surface charge accumulation, among other damaging phenomena. Moreover, transient electrical events can induce latch-up (in other words, inadvertent creation of a low-impedance path), thereby disrupting the functioning of the ICs and causing permanent damage to the ICs.

SUMMARY

In some embodiments, an integrated circuit device includes a semiconductor substrate having formed therein a bidirectional semiconductor-controlled rectifier (SCR) having a cathode/anode (K/A) electrically connected to a first terminal (T1) and an anode/cathode (A/K) electrically connected to a second terminal (T2). The integrated circuit device additionally includes a plurality of metallization levels formed above the semiconductor substrate. The integrated circuit device further includes a triggering device formed in the semiconductor substrate on a first side and adjacent to the bidirectional SCR. The triggering device includes one or more of a bipolar junction transistor (BJT) or an avalanche PN diode, where a first device terminal of the triggering device is commonly connected to the T1 with the K/A, and where a second device terminal of the triggering device is electrically connected to a central region of the bidirectional SCR through one or more of the metallization levels.

In some other embodiments, an integrated circuit device includes a semiconductor substrate having formed therein an NPNPN bidirectional semiconductor-controlled rectifier (SCR) having a cathode/anode (K/A) electrically connected to a first terminal (T1) and an anode/cathode (A/K) electrically connected to a second terminal (T2). The integrated circuit device additionally includes a plurality of metallization levels formed above the semiconductor substrate. The integrated circuit device additionally includes a triggering device formed in the semiconductor substrate on a first side of the NPNPN bidirectional SCR. The triggering device includes at least one of a bipolar junction transistor (BJT) or an avalanche diode, where a first device terminal of the triggering device is electrically connected to a central n-type region of the bidirectional SCR through one or more of the metallization levels of the integrated circuit device.

In some other embodiments, an integrated circuit device includes a semiconductor substrate having formed therein an NPNPN bidirectional semiconductor-controlled rectifier (SCR) having a cathode/anode (K/A) electrically connected to a first terminal (T1) and an anode/cathode (A/K) electrically connected to a second terminal (T2). The integrated circuit device additionally includes two or more triggering devices formed in the semiconductor substrate adjacent to the NPNPN bidirectional SCR. First device terminals of the two or more triggering devices are electrically connected to a central n-type region of the bidirectional SCR, and are electrically connected to each other through one or more of metallization levels of the integrated circuit device formed above the semiconductor substrate.

BRIEF DESCRIPTION OF THE DRAWINGS

FIGS. 7A-7L are schematic cross-sectional views of bidirectional protection devices having a triggering device and a gain-controlled bidirectional SCR with various optimizations, according to embodiments.

FIGS. 9A-9D schematically illustrate various embodiments of bidirectional protection devices having a triggering device and a gain-controlled bidirectional SCR, corresponding to pulsed voltage-time curves illustrated in FIGS. 8A-8B.

DETAILED DESCRIPTION

Figure 1A:
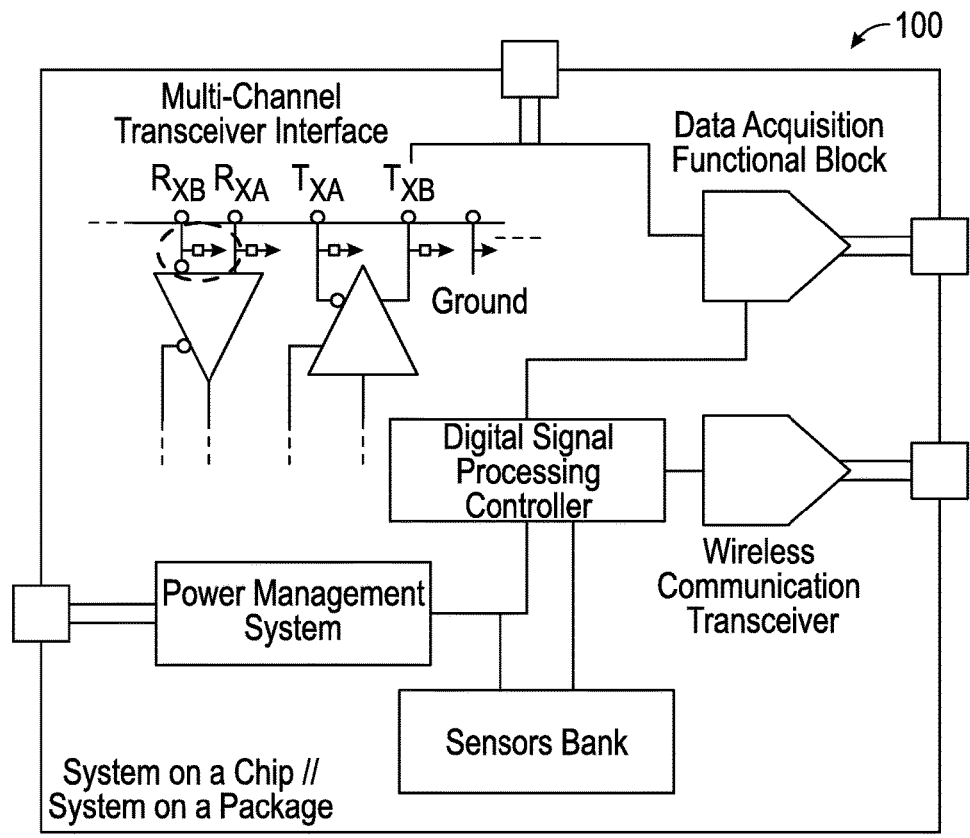
FIG. 1A is a schematic system on chip (SOC) or a system in package (SIP) having one or more system-level bidirectional protection devices, according to embodiments.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Emerging integrated circuits (ICs) for various applications including automotive and consumer electronics that are fabricated using low voltage CMOS processes are increasingly using input/output (I/O) interface pins that operate at relatively high bidirectional voltages. These ICs often operate in relatively harsh environments and should comply with applicable electrostatic discharge (ESD) and electromagnetic interference immunity (EMI) specifications. Robust ESD and EMI immunity is desirable because the ICs can be subject to a wide range of high voltage transient electrical events that exceed ordinary operating conditions.

The transient electrical events can be, e.g., a rapidly changing high energy signal such as an electrostatic discharge (ESD) event. The transient electrical event can be associated with an overvoltage event caused by a user contact. In other circumstances, the transient electrical event can be generated by a manufacturer to test the robustness of the transceiver integrated circuit—under a defined stress condition, which can be described by standards set by various organizations, such as the Joint Electronic Device Engineering Council (JEDEC), the International Electrotechnical Commission (IEC), and the Automotive Engineering Council (AEC).

Various techniques can be employed to protect a core or a main circuitry of the ICs against these damaging transient electrical events. Some systems employ external off-chip protection devices to ensure that core electronic systems are not damaged in response to the transient electrostatic and electromagnetic events. However, due to performance, cost, and spatial considerations, there is an increasing need for protection devices that are monolithically integrated with the main circuitry, that is, the circuitry to be protected Electronic circuit reliability is enhanced by providing protection devices to the pins or pads of an IC. The protection devices can maintain the voltage level at the pads within a predefined safe range by transitioning from a high-impedance state to a low-impedance state when the voltage of the transient electrical event reaches a trigger voltage. Thereafter, the protection device can shunt at least a portion of the current associated with the transient electrical event before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for a protection device to be configurable for different current and voltage (I-V) blocking characteristics and able to render effective protection against positive and negative transient electrical events with fast operational performance and low static power dissipation at normal operating voltage conditions.

One technology area where the protection requirements are increasingly becoming more complex in terms of speed balanced with current and voltage handling capabilities is technologies using a system on chip (SOC) or a system in package (SIP).

FIG. 1A is a schematic diagram of a system on a chip (SOC)/a system in package (SIP) 100 having integrated therein a bidirectional protection device, according to embodiments disclosed herein. The SOC/SIP 100 comprises a signal processing platform integrating various components for various applications, including consumer communication systems, healthcare vital signal processing, robotics and mission-critical industrial, instrumentation, aerospace and automotive platforms, among other applications. The SOC/SIP 100 includes one or more bidirectional protection devices (e.g., the dotted circled component), which can be system-level protection devices, at a transceiver interface, e.g., a multichannel transceiver interface ($R_{XA}$, $R_{XB}$, $T_{XA}$, $T_{XB}$, etc.) for protecting various components. The SOC/SIP 100 typically includes one or more of a main central digital signal processing controller, for instance a microprocessor and memory unit, which may be communicatively coupled to a data acquisition functional block for analog data sampling and data conversion, wireless transceivers for remote control, a sensor bank for alternatively sensing critical parametric of interest, for instance, temperature, pressure, strength, gas concentration, position, light intensity or chemical composition, a power management and energy harvesting system to condition the power conditions in the system, among other functional blocks. A SIP or heterogeneously integrated SOC having these and other functional blocks may be implemented in one or more semiconductor process technologies and have integrated therein bidirectional protection devices for reliable operation under variable environmental conditions associated with different end applications.

Figure 1B:
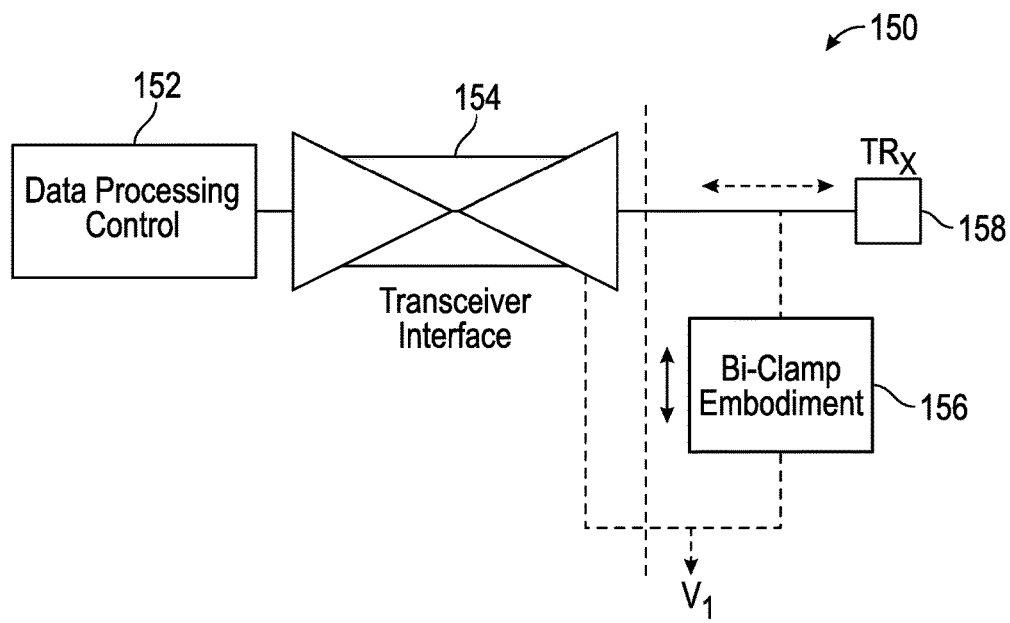
FIG. 1B is a schematic illustration of a transceiver integrated circuit having a bidirectional protection device, according to embodiments.

FIG. 1B is a schematic diagram of a transceiver IC 150 having integrated therein a bidirectional protection device 156, according to embodiments. The transceiver IC 150 includes a transceiver interface circuit 154 coupled to a core circuit 152, e.g., a multi-purpose data-processing control circuit, which may be used for various applications including data sampling and duplex communication applications in consumer communication systems, healthcare vital signal processing and mission-critical industrial, instrumentation and aerospace and automotive platforms, among others. The transceiver interface circuit 154 is configured to be coupled to a transceiver 158 for receiving and/or transmitting signals therebetween. When coupled to the transceiver 158, the transceiver interface circuit 154 is simultaneously directly electrically connected to the bidirectional protection device 156 for protecting the transceiver interface circuit 154. The core circuit 152 is configured to generate control signals for the transceiver interface 154 so as to control its operation of signaling.

Still referring to FIG. 1B, the bidirectional protection device 156 is electrically connected between the transceiver 158 and a power low voltage $V_1$, which can be, for example, a low impedance power low supply, such as ground. When a transient electrical event is received by the transceiver 158, e.g., through interface pins, the bidirectional protection device 156 can divert or shunt current associated with the transient electrical event to the power low voltage $V_1$, e.g., system ground (GND), thereby preventing damage to the internal circuit components electrically connected to the interface pins.

The transceiver interface circuit 154 can operate at input signals with a wide variety of common-mode voltage ranges. The ranges of overvoltage conditions under various operational environments include, e.g., the ranges defined by the ISO-7637 and ISO-16750 standards. To be responsive under these environments, it may be desirable to design the protection device 156 to operate at variable bidirectional blocking voltages, to respond fast (e.g., within 2 ns) and to handle large magnitudes of stress current, to safely prevent system damage during stress conditions as defined by, e.g. the IEC 61000-4-2 or ISO 10605 standards. In addition, it may be desirable, in some applications, to have the protection device 156 having variable and/or asymmetric trigger voltages and variable and/or asymmetric holding voltages.

Figure 1C:
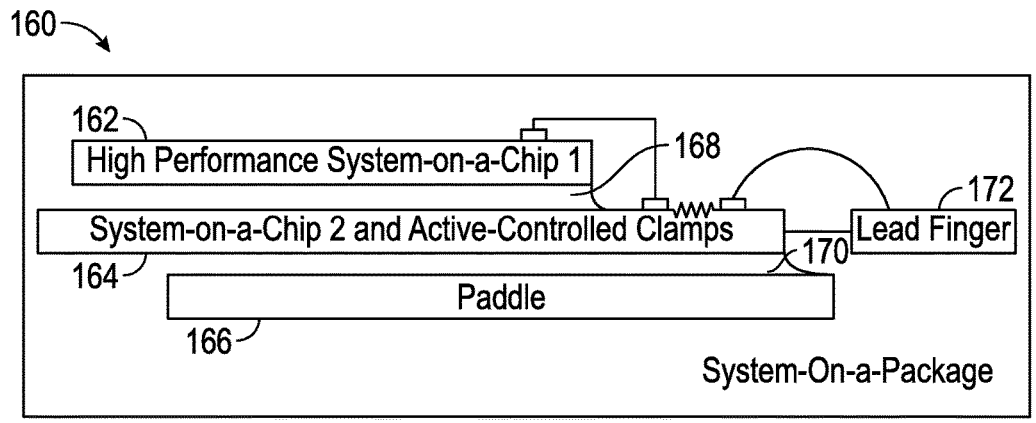
FIG. 1C is a schematic side view of system in package (SIP) arranged in a stacked configuration and having integrated therein a bidirectional protection device, according to embodiments.

FIG. 1C is a schematic side view of system in package (SIP) 160 arranged in a stacked configuration and having integrated therein a bidirectional protection device, according to embodiments. The SIP 160 includes a plurality of systems-on-chips (SOCs), including a first SOC 162 and a second SOC 164 that are communicatively coupled to each other and physically attached in a stacked configuration using a glue layer 168. The first SOC 162 can be, e.g., a high performance signal processing, sensing and communication SOC implemented in a first semiconductor process technology, and the second SOC 164 that can include a bidirectional protection device implemented in a second semiconductor process technology, according to embodiments. The second SOC 164 is configured to be coupled to an external contact lead 172 through the integrated bidirectional protection device, thereby providing protection for the SIP 160 against transient electrical events.

Figure 1D:
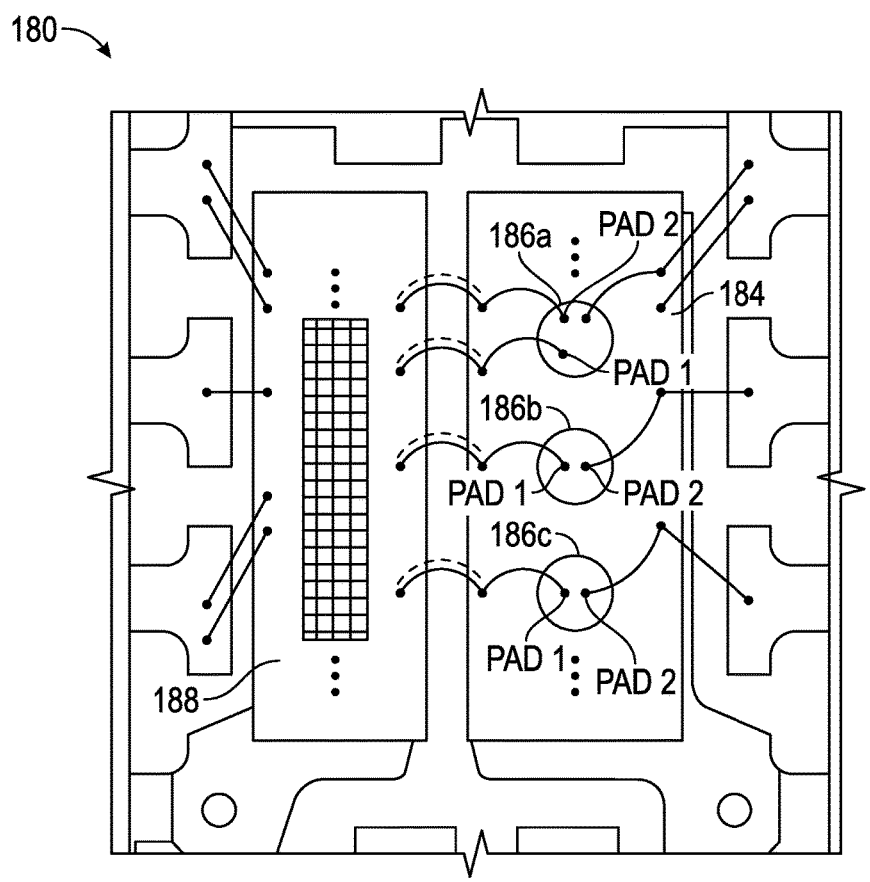
FIG. 1D is a schematic plan view of a system in package (SIP) arranged in a laterally adjacent configuration having integrated therein a bidirectional protection device, according to embodiments.

FIG. 1D is a schematic plan view of a system in package (SIP) 180 arranged in a laterally adjacent configuration having integrated therein a bidirectional protection device, according to embodiments. The SIP 180 includes a plurality of SOCs, including a first system-on-a-chip (SOC) 184 and a second system-on-a-chip (SOC) 188 that are communicatively coupled and laterally adjacent to each other. The second SOC 188 can be, e.g., a high-performance signal-processor, isolator, sensing or communications SOC implemented in a plurality of specialized semiconductor process technologies. The first SOC 184 can include a plurality of bidirectional protection devices 186a-186c implemented in a different semiconductor process technology, according to embodiments. The second SOC 184 is configured to be coupled to a plurality external contact leads through bidirectional protection devices that are integrated therein, thereby providing protection for the SIP 180 against transient electrical events. A plurality of connections between the different dies incorporated within the SOC or between the dies and the package pins can be formed as appropriate for the application within the scope of the disclosed technology.

Figure 2A:
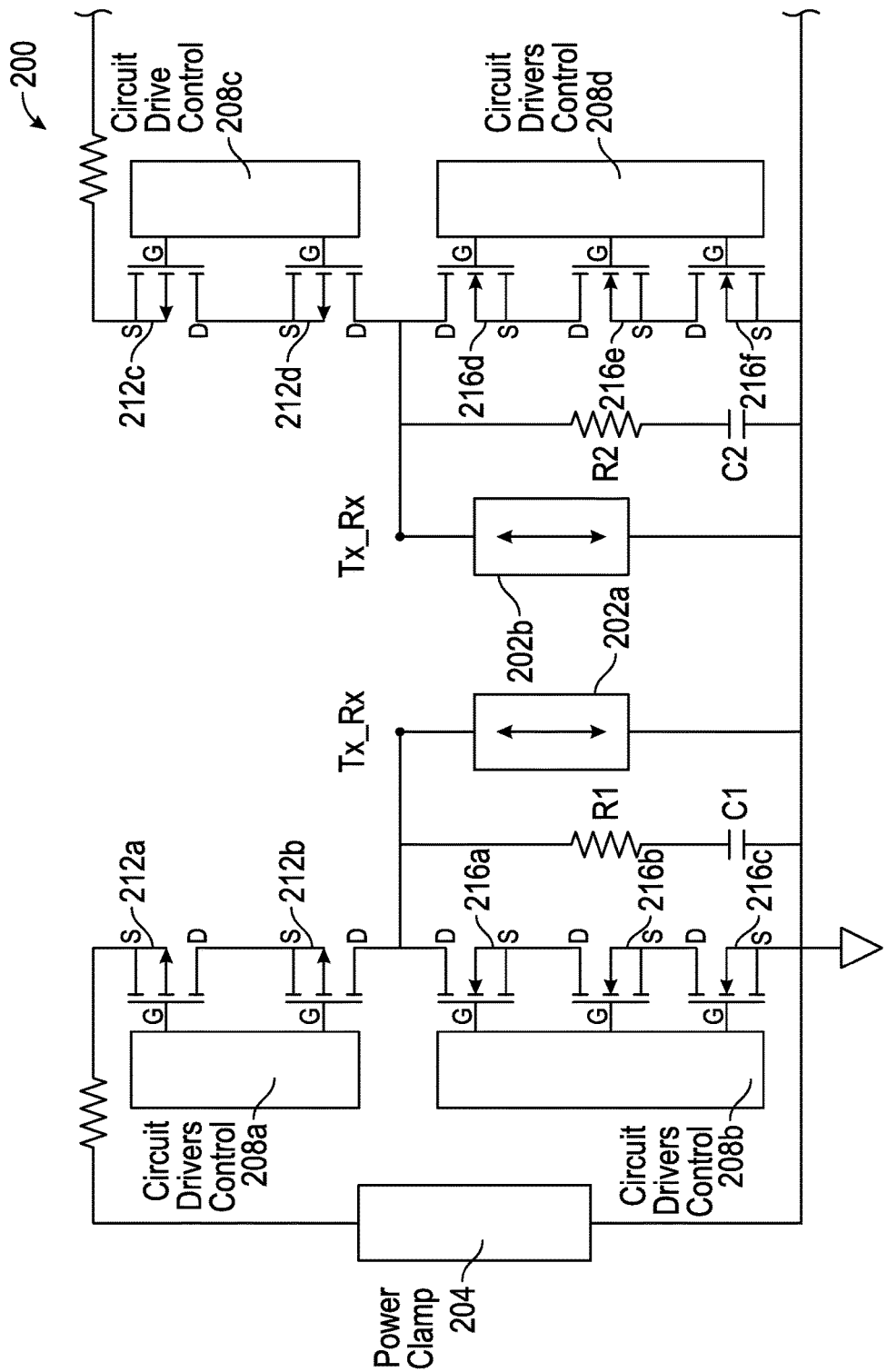
FIGS. 2A and 2B are schematic circuit diagrams of example transceiver interfaces having a bidirectional protection device, according to embodiments.
Figure 2B:
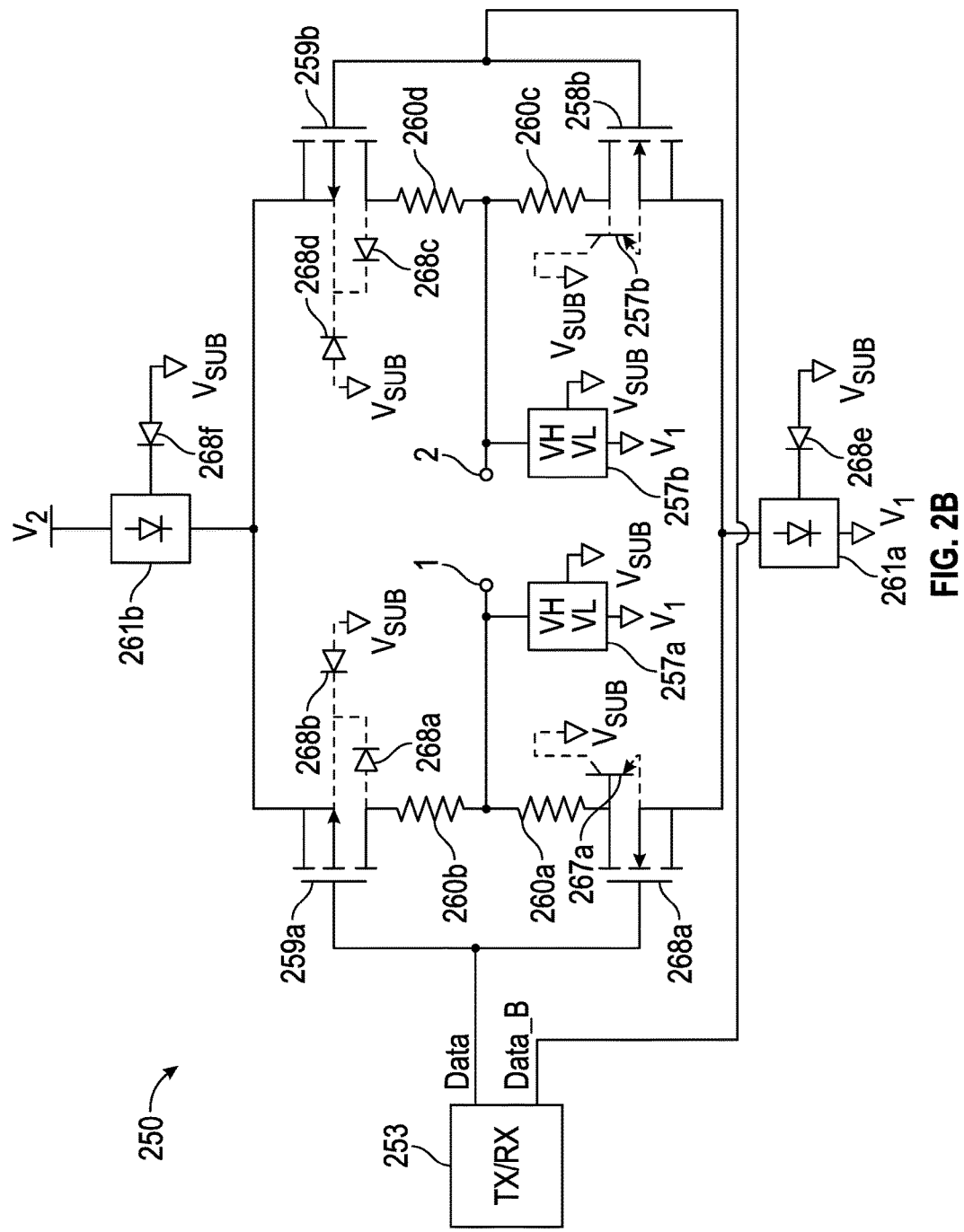

FIGS. 2A and 2B illustrate circuit diagrams of transceiver interfaces 200 and 250, respectively, which can be implemented with the bidirectional protection devices, according to embodiments. The transceiver interfaces 200, 250 can be, for example, an interface IC, such as a half or full duplex communication transceiver IC in which the terminals or pins are directly exposed to a user, for instance, connected to car cables or an industrial machinery hardness, in a normal operational environment. The transceiver interfaces 200, 250 can be used to communicate data over the interface, such as by using low voltage differential signaling.

Referring to FIG. 2A, the transceiver interface 200 includes first and second terminals (left and right Tx_Rx's), a power clamp 204, first through fourth circuit driver control units 208a-208d, a first clamp device 202a, a second clamp device 202b, first though sixth n-type metal oxide semiconductor (NMOS) transistors 216a-216f, first thorough fourth p-type metal oxide semiconductor (PMOS) transistors 212a-212d, a first resistor R1, and a second resistor R2.

The NMOS transistors 216a-216f and PMOS transistors 212a-212d can be used for electrically transmitting signals over the terminals Tx_Rx. For example, the circuit driver control units 208a-208d can be used to control the gate voltages of the NMOS transistors 216a-216f and PMOS transistors 212a, 212d to control a differential voltage between the terminals Tx_Rx. The voltage can have positive or negative polarity.

The first clamp device 202a includes a first terminal electrically connected to the first terminal Tx_Rx (left) and a second terminal electrically connected to a power low voltage, a substrate voltage $V_{SUB}$. Similarly, the second clamp device 202b includes a first terminal electrically connected to the second terminal Tx-Rx (right) and a second terminal electrically connected to a substrate voltage $V_{SUB}$.

The first and second clamp devices 202a, 202b can be used to protect the transceiver interface 200 from ESD and/or EMI events. The clamp devices 202a, 202b can protect components of the transceiver interface 200 including, for example, parasitic substrate devices associated with the components.

FIG. 2B shows a circuit diagram of another transceiver interface 250, which can include one or more dual-polarity overvoltage clamp devices described herein, according to embodiments. The transceiver interface 250 includes a first pin 1, a second pin 2, a transceiver circuit (Tx/Rx) 253, a first clamp device 257a, a second clamp device 257b, a first n-type metal oxide semiconductor (NMOS) transistor 258a, a second NMOS transistor 258b, a p-type metal oxide semiconductor (PMOS) transistor 259a, a second PMOS transistor 259b, a first resistor 260a, a second resistor 260b, a third resistor 260c, a fourth resistor 260d, a first diode structure 261a, and a second diode structure 261b.

The NMOS transistors 258a, 258b and PMOS transistors 259a, 259b can be used for electrically transmitting signals over the first and second pins 1, 2. For example, the transceiver circuit 253 can be used to control the gate voltages of the NMOS transistors 258a, 258b and PMOS transistors 259a, 259b, e.g., to control a differential voltage between the first and second pins 1, 2. The voltage can have positive or negative polarity.

Still referring to FIG. 2B, the transceiver interface 250 can receive power from a power high supply voltage $V_2$ and a power low supply voltage $V_1$. Certain components of the transceiver interface 250, such as the NMOS transistors 258a, 258b, PMOS transistors 259a, 259b, diode structures 261a, 261b, and clamp devices 257a, 257b can be fabricated in a substrate that is biased using a substrate voltage $V_{SUB}$.

Various parasitic substrate devices can be present in the transceiver interface 250. The parasitic substrate devices can include terminals electrically connected to the substrate voltage $V_{SUB}$. Absent protection, the parasitic substrate devices may be damaged during ESD and/or EMI conditions.

In the illustrated configuration, the NMOS transistors 258a, 258b include parasitic substrate bipolar transistors 267a, 267b, respectively. Additionally, the PMOS transistors 259a, 259b include parasitic substrate diodes 268a-268d. Furthermore, the diode structures 261a, 261b include parasitic substrate diodes 268e, 268f, respectively. Although a certain parasitic substrate devices are shown in FIG. 2B, other configurations of parasitic substrate devices are possible.

The first clamp device 257a includes a first terminal VH electrically connected to the first pin 1, a second terminal VL electrically connected to the power low voltage $V_1$, and a substrate terminal electrically connected to the substrate voltage $V_{SUB}$. Additionally, the second clamp device 257b includes a first terminal VH electrically connected to the second pin 2, a second terminal VL electrically connected to the power low voltage $V_1$, and a substrate terminal electrically connected to the substrate voltage $V_{SUB}$. The first and second clamp devices 257a, 257b can be used to protect the transceiver interface 250 from ESD and/or EMI events. The clamp devices 257a, 257b can protect components of the transceiver interface 250 including, for example, parasitic substrate devices associated with the components.

The transceiver interfaces 200 and 250 of FIGS. 2A and 2B, respectively, illustrate examples transceiver interfaces that can be implemented with bidirectional protection devices described herein. However, the transceiver interfaces can be implemented in other ways to meet communication protocol constraints.

Additionally, although the clamp devices have been illustrated in the context of transceiver interfaces, the clamp devices described herein can be used in a wide range of ICs and other electronics, including, for example, industrial control systems, interface systems, power management systems, microelectromechanical system (MEMS) sensor systems, automotive systems, wireless infrastructure systems, and/or digital signal processing (DSP) systems. Additionally, although the transceiver interface 20 has been illustrated as including two signal pins and two clamp devices, more or fewer clamp devices and pins can be included to meet system specifications. Furthermore, the clamp devices can be connected in other ways. For example, the terminals of the clamp devices can be connected in other ways, such as to other nodes and/or voltages.

Figure 3A:
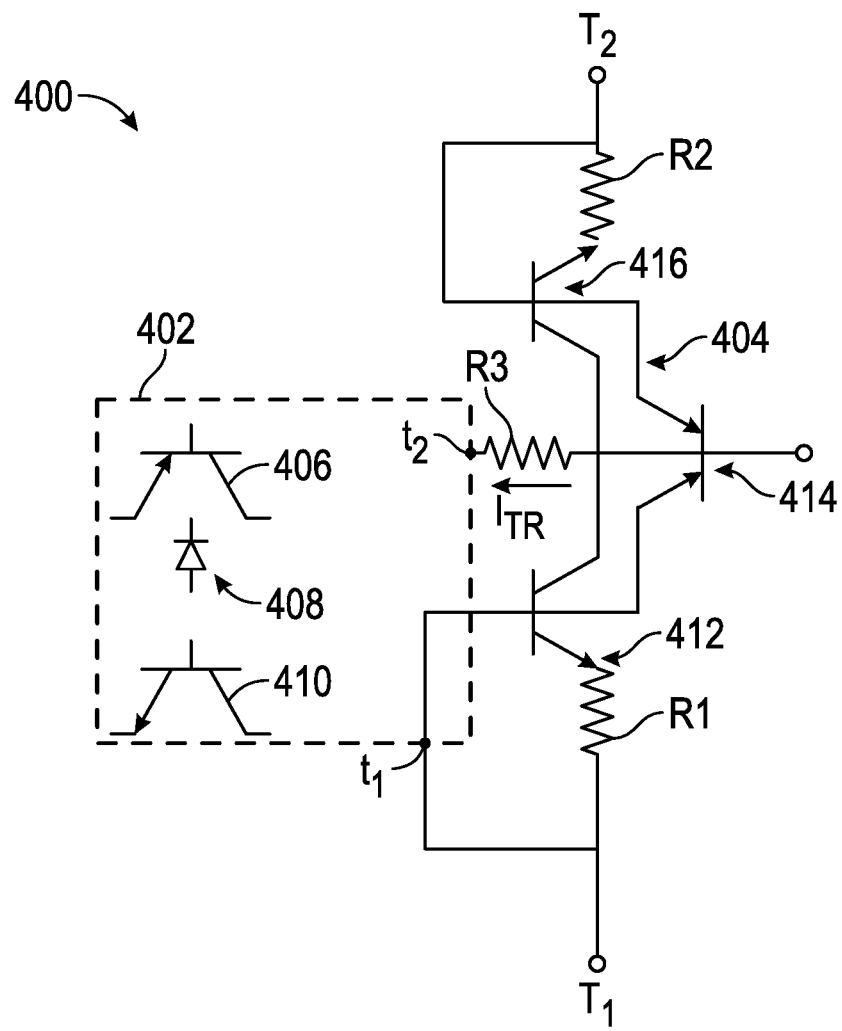
FIG. 3A is a schematic circuit diagram of a bidirectional protection device having a triggering device and a gain-controlled bidirectional semiconductor-controlled rectifier (SCR), according to embodiments.

FIG. 3A is a schematic circuit diagram of a bidirectional protection device 400 having a triggering device and a gain-controlled bidirectional semiconductor-controlled rectifier (SCR), according to embodiments. Referring to FIG. 3A, the bidirectional protection devices 400 includes a first terminal (T1) and a second terminal (T2) configured to receive a transient electrical signal therebetween, e.g., a transient positive or negative voltage signal that may exceeds a triggering voltage of the bidirectional protection device 400. For example, one of the T1 or T2 can be a signal pin or pad of an IC, and the other of the T1 or T2 can be a power low pin or pad, such as a pad associated with the power low voltage supply such as $V_{SS}$ or ground.

The bidirectional protection device 400 of FIG. 3A includes a triggering device 402 configured to provide a first current shunt path and a bidirectional semiconductor-controlled rectifier (SCR) 404 configured to provide a second current shunt path. The triggering device 402 and the bidirectional SCR 404 are electrically coupled to each other and configured such that the triggering device 402, upon thresholding or triggering, discharges or receives a first current, or discharges a charge carrier (i.e., electrons or holes), which at least in part causes the bidirectional SCR 404 to trigger to discharge a second current.

Figure 4B:
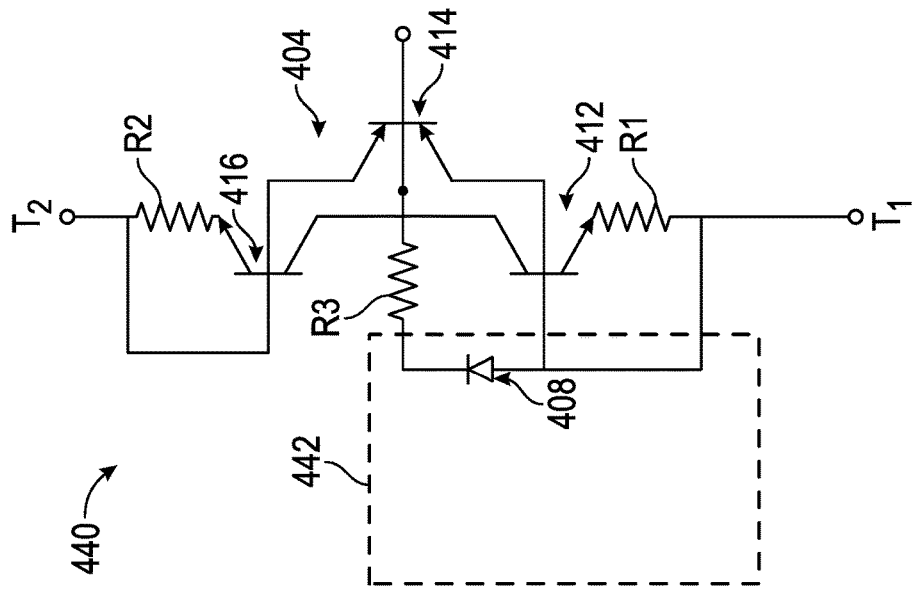
FIG. 4B is a schematic circuit diagram of a bidirectional protection device having an avalanche diode-based triggering device and a gain-controlled bidirectional SCR, according to embodiments.
Figure 4A:
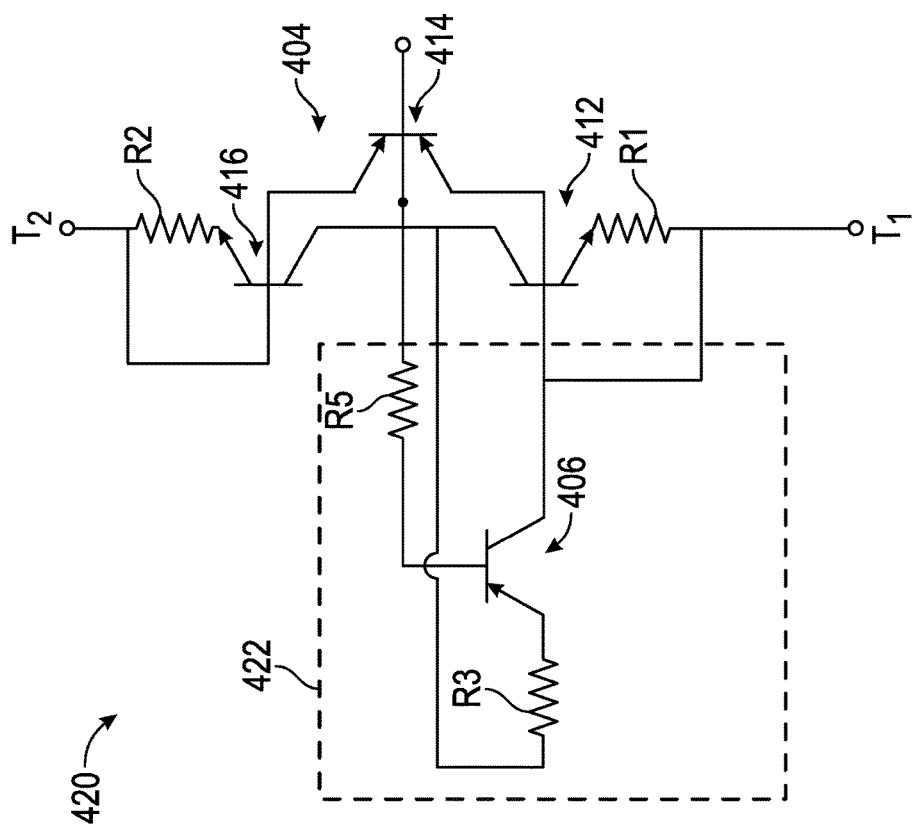
FIG. 4A is schematic circuit diagram of a bidirectional protection device having a PNP bipolar junction transistor-based triggering device and a gain-controlled bidirectional SCR, according to embodiments.
Figure 4C:
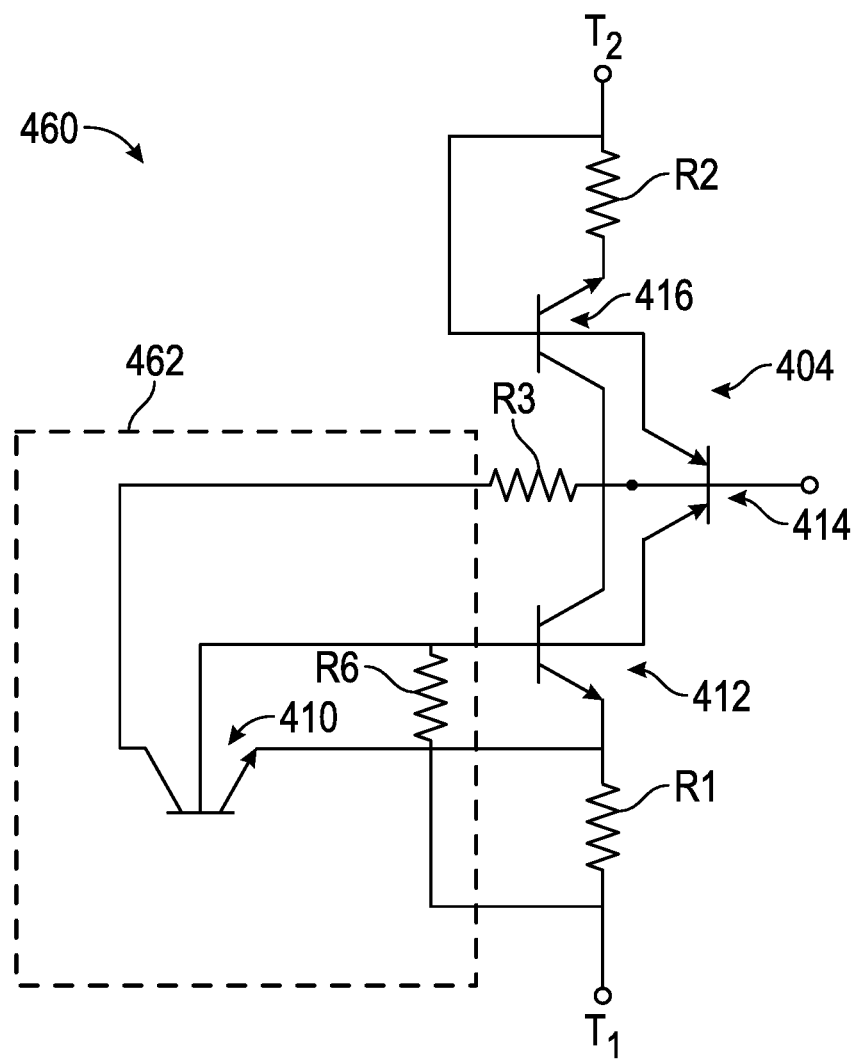
FIG. 4C is schematic circuit diagram of a bidirectional protection device having an NPN bipolar junction transistor-based triggering device and a gain-controlled bidirectional SCR, according to embodiments.

The triggering device 402 of the bidirectional protection device 400 includes one or more of an NPN bipolar junction transistor (BJT) 410, a PNP bipolar junction transistor (BJT) 406 or an avalanche PN diode 408. Examples of the triggering device 402 having various devices are described more in detail infra. FIG. 4A illustrates an embodiment having an NPN BJT, FIG. 4B illustrates an example embodiment having an avalanche PN diode, and FIG. 4C illustrates an embodiment having a PNP BJT. The triggering device 402 has a first device terminal t1 and a second device terminal t2, each of which may be one of transistor terminals or diode terminals of the triggering device 402. The t1 of the triggering device 402 is electrically connected, e.g., directly connected, to the T1 of the bipolar protection device 400, while t2 of the triggering device 402 is electrically connected, e.g., connected through a third resistor (R3), to the bidirectional SCR 404 and configured to supply current thereto or receive current therefrom (i.e., to supply a charge carrier). In various embodiments, the t2 of the triggering device may be connected to a central region of the bidirectional SCR 404, e.g., the central n-type region of an NPNPN bidirectional SCR.

It will be appreciated that, while not shown in FIG. 3A, an additional triggering device may be present, which has a third terminal (t3, not shown), which is electrically connected, e.g., directly connected, to the T2 of the bipolar protection device 400 and commonly connected to the bidirectional SCR 404 through the third resistor (R3). An embodiment having the additional triggering device is described in more detail infra with respect to FIG. 5.

The bidirectional SCR 404 includes a first NPN bipolar transistor (BJT) 412, a PNP bidirectional bipolar transistor (BJT) 414, and a second NPN bipolar transistor (BJT) 416. The emitter of the first NPN BJT 412 is electrically connected to T1 through a first resistor R1 and the base of the first NPN BJT 412 is commonly electrically connected to T1, such that the collector and the base of the first NPN BJT 416 are electrically connected to each other through the R1. The base of the first NPN BJT 412 is electrically connected to a collector/emitter (C/E) of the PNP bidirectional BJT 414, and the collector of the first NPN BJT 412 is electrically connected to the base of the PNP bidirectional BJT 414. Analogously, the emitter of the second NPN BJT 416 is electrically connected to T2 through a second resistor R2 and the base of the second NPN BJT 416 is commonly electrically connected to T2, such that the collector and the base of the second NPN BJT 416 are electrically connected to each other through the R2. The base of the second NPN BJT 416 is electrically connected to an emitter/collector (E/C) of the PNP bidirectional BJT 414, and the collector of the second NPN BJT 416 is electrically connected to the base of the PNP bidirectional BJT 414.

Referring now to electrical connections between the triggering device 402 and the bidirectional SCR 404 illustrated in FIG. 3A, the first device terminal t1 of the triggering device 402 is electrically connected to the emitter of the first NPN BJT 412 through the first resistor R1. That is, the emitter of the first NPN BJT 412 and the first device terminal t1 of the triggering device 402 are commonly electrically connected to the T1 for receiving a transient electrical signal. In addition, the second device terminal t2 of the triggering device 402 is electrically connected to the base of the PNP bidirectional BJT 414 through the third resistor R3, such that once activated, the triggering device 402 is configured to provide to or receive from the bidirectional SCR 404 triggering current $I_{TR}$ to at least in part cause the activation of the bidirectional SCR 404, which is discussed more in detail below. In the illustrated embodiment, the triggering device 402 is configured to supply electrons to the base region of the PNP bidirectional BJT 414. In the following, operational principles of the bidirectional SCR 404 are described, followed by operational principles of the triggering device 402 and the electrical coupling of the triggering device 402 to the bidirectional SCR 404.

In one illustrative aspect, the bidirectional SCR 404 can be described as including the PNP bidirectional BJT 414 and the first NPN BJT 412 that are configured as a first NPNP SCR to be activated in response to a positive voltage received at the T2 relative to the T1 (or a negative voltage received at the T1 relative to the T2). The bidirectional SCR 404 can be described as additionally including the PNP bidirectional BJT 414 and the second NPN BJT 416 that are configured as a second NPNP SCR to be activated in response to a positive voltage received at the T1 relative to the T2 (or a negative voltage received at the T2 relative to the T1). In this way, the bidirectional SCR 404 can be triggered in either voltage polarities between the T1 and the T2.

The first NPNP SCR comprises: a first N-region comprising the emitter of the first NPN BJT 412; a first P-region comprising the collector/emitter (C/E) of the PNP bidirectional BJT 414 that can be common with or connected to the base of the first NPN BJT 412; a second N-region comprising the base of the PNP bidirectional BJT 414 that can be common with or connected to the collector of the first NPN BJT 412; and a second P-region comprising the emitter/collector (E/C) of the PNP bidirectional BJT 414. As described herein, the first N-region, the second N-region, and the second P-region may sometimes referred to as a "cathode," a "gate," and an "anode," respectively, of the first NPNP SCR.

Similarly, the second NPNP SCR comprises: a first N-region comprising the emitter of the second NPN BJT 416; a first P-region comprising the emitter/collector (E/C) of the PNP bidirectional BJT 414 that can be common with or connected to the base of the second NPN BJT 416; a second N-region comprising the base of the PNP bidirectional BJT 414 that can be common with or connected to the collector the second NPN BJT 416; and a second P-region comprising the collector/emitter (C/E) of the bidirectional PNP BJT 414. As described herein, the first N-region, the second N-region, and the second P-region may sometimes be referred to as a "cathode," a "gate," and an "anode," respectively, of the second NPNP SCR.

Without being bound to any theory, it will be appreciated that each of the first and second NPNP SCRs can be activated in different ways. One mode of activation is associated with a voltage applied between the cathode and the anode of the first or second NPNP SCR. This mode is sometimes referred to as voltage triggering, which occurs when a forward voltage (i.e., a positive voltage) exceeding a threshold value is placed between an anode relative to the cathode of an NPNP SCR. Under a forward voltage below a threshold voltage of the first NPNP SCR, the first NP junction between the first N-type region and first P-type region and the second NP junction between the second N-type region and the second P-type region are forward biased, while the middle PN junction between the first P-type region and the second N-type region is initially reverse biased. Initially, little current flows across the PNPN SCR because little carriers cross the middle PN junction. However, at or above a forward voltage exceeding the first threshold value of the first NPNP SCR, the first NPNP SCR begins to conduct in part due to avalanche multiplication of carriers in the middle PN junction. Once the breakdown begins, an increase in majority carriers in the first P-type region and the second N-type region drives the middle PN junction to be forward biased, resulting in a low impedance state in which all junctions of the first NPNP SCR become forward biased. An analogous condition may trigger the second NPNP SCR into a low impedance state when a when a forward voltage exceeding a threshold value is placed between an anode relative to the cathode of the second NPNP SCR.

Under voltage triggering mode, when a transient electrical event induces a negative voltage on the T1 relative to the T2, whose absolute value exceeds a first triggering voltage ($V_{TR1}$), or a negative voltage on the T2 relative to the T1, whose absolute value exceeds a second triggering voltage ($V_{TR2}$), the first and second NPNP SCRs may both be thresholded such that the bidirectional SCR 204 is activated. As an illustrative example sequence of events with respect to the bidirectional SCR 404 of FIG. 3A, in response to a negative voltage on the T1 relative to the T2 exceeding $V_{TR1}$, the first NPN BJT 412 may begin to conduct, resulting in its collector potential being pulled down, which in turn pulls down the base potential of the PNP bidirectional BJT 414. This in turn causes the junction breakdown of the middle NP junction, causing the PNP bidirectional BJT 414 to conduct. When the PNP bidirectional BJT 414 starts to conduct, its collector potential is pulled up, which in turn pulls up the base potential of the second NPN BJT 416. Alternatively, in response to a negative voltage on the T2 relative to the T1 exceeding $V_{TR2}$, an analogous sequence of events can lead to triggering of the bipolar SCR 404 into a conductive state. Once the bidirectional SCR 404 is triggered in this way, it enters into a low impedance mode, in which a low impedance can be maintained by a feedback loop formed between one of the first and second NPN BJTs 412, 416 and the PNP bidirectional BJT 414 as discussed above, even if the absolute voltage across the T1 and T2 subsequently falls below $V_{TR1}$ and $V_{TR2}$.

In addition to the voltage triggering mode of activation discussed above, the activation of the bipolar SCR 404 can be caused by another mode of activation when majority carriers are supplied to the gate of the first and second NPNP SCRs described above, which is the base of the PNP bidirectional BJT 414 in FIG. 3A. This second mode, sometimes referred to as gate-triggering, occurs when, in combination to the forward voltage across the first or second NPNP SCR as described above, charge carriers are supplied (e.g., electrons) to the gate (e.g., the base of the PNP bidirectional BJT 414) of the first or second NPNP SCR). The charge carriers supplied to the gate of the NPNP SCRs accelerates the low impedance state by supplying the majority carriers to the gate region such that the forward biasing of the middle PN junction may be accelerated, thus accelerating the low impedance state. In the bidirectional SCR 404 of FIG. 3A, the triggering device 402 is configured to supply the charge carriers to the gate of the first and second NPNP SCRs.

In operation, the triggering device 402 may be activated, among other factors, when the voltage across t1 and t2 exceeds the threshold or triggering voltage of the triggering device 402. Upon being activated, the triggering device 402 causes the generation of the triggering current $I_{TR}$, which at least in part causes the bidirectional SCR 404 to be activated. Example embodiments of the triggering device 402 are described infra with respect to FIGS. 4A-4C.

Figure 3B:
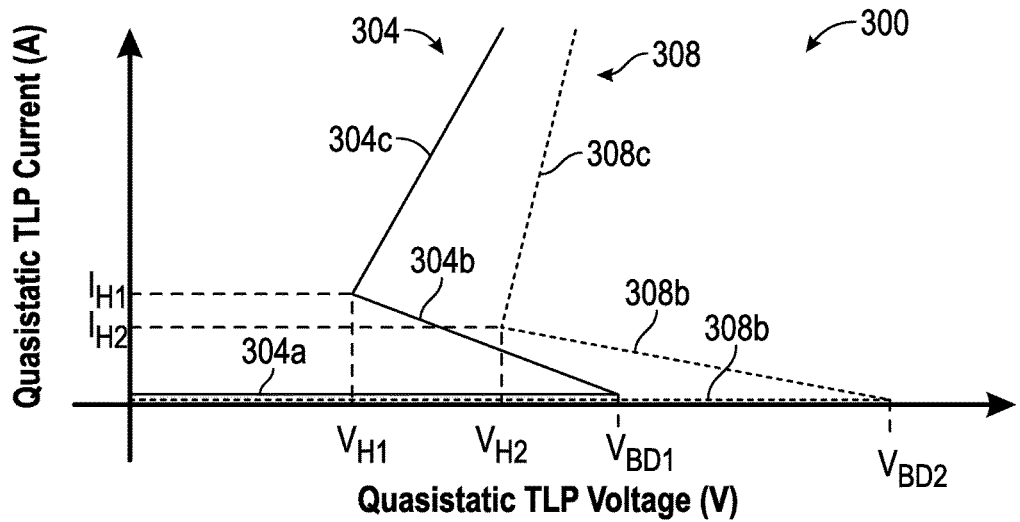
FIG. 3B illustrates schematic quasistatic current-voltage curves of a triggering device and a gain-controlled bidirectional SCR, according to embodiments.

FIG. 3B is a schematic graph 300 illustrating current-voltage (IV) curves of a triggering device and a gain-controlled bidirectional SCR that would be obtained individually if the triggering device was not connected to cause the triggering of the bidirectional SCR. In particular, the graph 304 schematically illustrates a quasistatic response of the bidirectional SCR 404 to a voltage signal received between the T1 and T2, and the graph 308 schematically illustrates a quasistatic response of the triggering device 402 to a voltage signal received between the t1 and t2. The x-axis and the y-axis represent the quasistatic voltage and the corresponding current, respectively. The IV curves 304 and 308 have respective blocking regions ("OFF" regions) 304a and 308a, respectively characterized by very high impedances, between the origin and respective breakdown voltages $V_{BD1}$ and $V_{BD2}$. $V_{BD1}$ may correspond to a triggering voltage ($V_{TR}$) of the SCR and $V_{BD2}$ may correspond to a threshold voltage ($V_{TH}$) of a BJT or an avalanche diode of the triggering device. When the voltage across T1 and T2 reaches $V_{BD1}$ and across t1 and t2 reaches $V_{BD2}$, dV/dI becomes zero and switching of the respective bidirectional SCR 404 and the triggering device 402 occurs. The blocking regions 304a and 308a are followed by respective negative resistance regions 304b and 308b (also referred to as "snap-back region") between $V_{BD1}$ and a first hold voltage $V_{H1}$ and between $V_{BD2}$ and a second hold voltage $V_{H2}$, respectively, followed by respective positive resistance regions ("ON" regions) 304c and 308c. At the hold voltages $V_{H1}$ and $V_{H2}$, the corresponding holding current values are $I_{H1}$ and $I_{H2}$, respectively, which can represent minimum level of currents that can maintain the "ON" states of the respective devices. According to embodiments, the bidirectional SCR 404 and the triggering device 402 are configured such that, under quasistatic conditions or in response to a voltage signal having a relatively long duration (e.g., longer than about 100 ns or longer than about 1 μs), the $V_{BD1}$ of the bidirectional SCR 404 is lower than the $V_{BD2}$ of the triggering device 402. For example, the bidirectional SCR 404 may be configured to have, under a quasistatic condition, a $V_{BD1}$ between about 5V and about 25V, or between about 10V and about 20V, for instance about 15V, while the triggering device 402 may be configured to have a $V_{BD2}$ between about 10V and about 40V, between about 15V and about 35V, or between about 20V and about 30V, for instance about 25V.

Figure 3C:
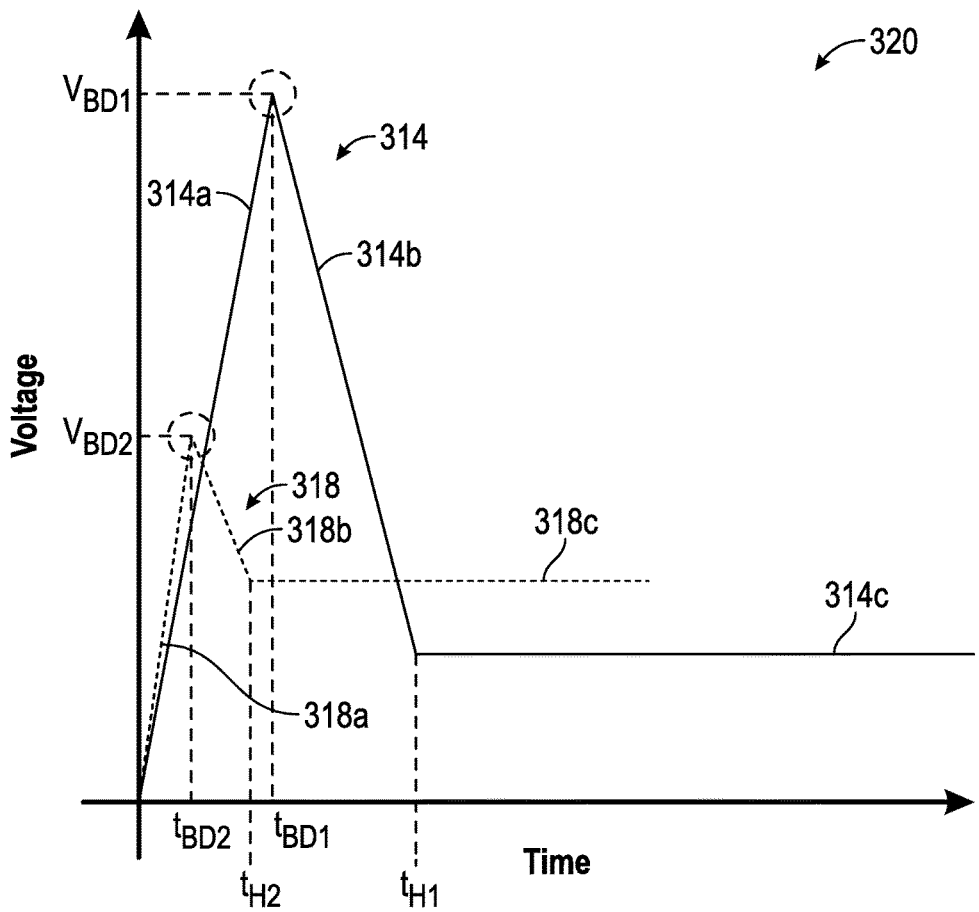
FIG. 3C illustrate schematic voltage-time curves of the triggering device and the gain-controlled bidirectional SCR corresponding to a triggering device and a gain-controlled bidirectional SCR individually, according to embodiments.

FIG. 3C is a schematic graph 320 illustrating voltage-time (V-t) curves of a triggering device and a gain-controlled bidirectional semiconductor-controlled rectifier similar to those described with respect to FIG. 3A, individually (i.e., without being connected to each other), for illustrative purposes. In particular, the graph 314 schematically illustrates a response of the bidirectional SCR 404 to a relatively short-pulsed (e.g., shorter than about 1 μm or shorter than about 100 ns) voltage signal received between the T1 and T2, and the graph 318 schematically illustrates a response of the triggering device 402 to a relatively short-pulsed voltage signal received between the t1 and t2. The x-axis and the y-axis of the graph 320 represent time and the transmission line pulsed (TLP) voltage, respectively. The V-t curves 314 and 318 have respective blocking regions ("OFF" regions) 314a, 318a characterized by very high impedances, between the origin and respective breakdown times $t_{BD1}$ and $t_{BD2}$ corresponding to the bidirectional SCR 404 and the triggering device 402. At $t_{BD1}$ and $t_{BD2}$, dV/dt reaches zero and the switching of the triggering device 402 occurs, followed by the switching of the bidirectional SCR 404 occurs. The blocking regions 314a and 318a are followed by respective negative resistance regions 314b and 318b between the $t_{BD1}$ and first hold time $t_{H1}$ and between $t_{BD2}$ and second hold time $t_{H2}$, respectively, followed by respective positive resistance regions ("ON" regions) 314c and 318c. At the hold times $t_{H1}$ and $t_{H2}$, the corresponding current values are $I_{H1}$ and $I_{H2}$. Unlike responses of the respective devices to quasistatic voltage signals as described above with respect to FIG. 3B, the bidirectional SCR 404 and the triggering device 402 are configured such that, in response to a relatively short duration, e.g., in response to a transmission line pulses received between T1 and T2 and between t1 and t2, the $V_{BD1}$ of the bidirectional SCR 404 is substantially higher than the $V_{BD2}$ of the triggering device 402. For example, the bidirectional SCR 404 may be configured to have, under a TLP condition having a very short transient voltage duration, having e.g., a rise time between about 100 ps and about 10 ns, for instance 600 ps, and/or having a pulse width between about 5 ns and about 500 ns, for instance 100 ns, a $V_{BD1}$ between about 50V and about 150V, between about 75V and about 125V, for instance about 100V, while the triggering device 402 may be configured to have $V_{BD2}$ that is substantially lower at about 10V and about 50V, between about 20V and about 40V, for instance about 30V.

As illustrated by FIGS. 3B and 3C, the voltage at which each of the bidirectional SCR 404 and the triggering device 402 can be activated to low impedance states can depend on the duration, e.g. temporal width, of the activating signal received by the respective device. Conversely, the speed at which each of the bidirectional SCR 404 and the triggering device 402 can be activated to low impedance states can depend on the voltage of the activating signal received by the respective device. Without being bound to any theory, such reduction is sometimes referred to as the dV/dt effect, the magnitude of whose effect can depend on, among other factors, the capacitances of reverse biased junctions. Based on this effect, inventors have recognized that, as illustrated in FIG. 3C, the bidirectional protection device 400 can be configured such that V-t curves 318 and 314 associated with activation of the bidirectional SCR 404 and the triggering device 402 can be customized, e.g., to overlap or to be separated. In the illustrated example, the peaks of the V-t curves of the bidirectional SCR 404 and the triggering device 402 can be tailored to be within a certain time window, for example, to prevent physical damage to the triggering device 402, which may not be configured to handle as much current as the bidirectional SCR 404. For example, in various embodiments, for the bidirectional SCR 404 and the triggering device 402 having $V_{BD1}$ and $V_{BD2}$ values described above with respect to FIG. 3B, for transient voltage signals having, e.g., a rise time between about 100 ps and about 10 ns, for instance 600 ps, and/or having a pulse width between about 5 ns and about 500 ns, for instance 100 ns, the difference ($t_{BD1}$–$t_{BD2}$) between the peaks of the V-t curves 314 and 318 can be, for example between about 200 ps and about 10 ns, between about 150 ps and about 5.5 ns, for instance about 3 ns.

Still referring to FIGS. 3B and 3C, it will be appreciated that, under certain conditions, a transient voltage signal may activate the triggering device but not activate the bidirectional SCR, e.g., when the voltage of the transient voltage signal is between $V_{BD1}$ and $V_{BD2}$ and/or when the duration of the transient voltage signal is between $t_{BD1}$ and $t_{BD2}$.

Referring back to FIG. 3C, for certain applications, it may be desirable to have a relatively high holding voltage ($V_H$) of the bidirectional SCR to prevent damage to a passive component, such as a resistor that may be connected in series with the bidirectional protection device. Referring back to FIG. 3A, in various embodiments described herein, the $V_H$ may be increased by decreasing the emitter injection efficiency and current gain of the first and/or second NPN BJTs 412, 416, which may in turn be achieved by connecting the emitter region of the first NPN BJT 412 to a first resistor R1 and connecting the emitter region of the second NPN BJT 412 to a second resistor R2. In various embodiments, by tailoring each of the R1 and R2 to have a resistance value in a range between about 0.001 Ohms and about 20 Ohms, between about 0.5 Ohms and about 2 Ohms, or between about 2 Ohms and about 10 Ohms, the $V_H$ of the bidirectional SCR 404 can be correspondingly tailored to have a value in the range between about 3 V and about 15 V, between about 4V and about 5V, or between about 5V and about 8V, respectively.

FIGS. 4A-4C are schematic circuit diagrams of bidirectional protection devices with different triggering devices, according to various embodiments. Similar to the bidirectional protection device 400 described above with respect to FIG. 3A, each of the embodiments illustrated in FIGS. 4A-4C includes a bidirectional SCR 404 and a triggering device, wherein the triggering device and the bidirectional SCR 404 are electrically coupled to each other such that the triggering device, upon being activated, causes carriers, e.g., electrons, to flow into or out of the bidirectional SCR 404, which at least in part causes the bidirectional SCR 404 to be activated.

FIG. 4A illustrates a bidirectional protection device 420 in which the triggering device 422 includes a PNP triggering BJT 406, according to embodiments. The PNP triggering BJT 406 includes a collector electrically connected to the base of the first NPN BJT 412 and to the T1, and further includes a base electrically connected to the base of the PNP bidirectional BJT 414 of the bidirectional SCR 404, through a fifth resistor R5. The PNP triggering BJT 406 further includes an emitter connected to the collectors of the first and second NPN BJTs 412, 416 of the PNP bidirectional SCR 414, through a third resistor R3. When the bidirectional protection device 420 receives a negative transient electrical signal at the T1 relative to the T2, the PNP triggering BJT 406 is activated, thereby supplying electrons to the bidirectional SCR 404 through the base of the PNP bidirectional BJT 414, which in turn accelerates the activation of the bidirectional SCR 404 into a low impedance state, as discussed above in connection with FIG. 3A.

FIG. 4B illustrates a bidirectional protection device 440 in which the triggering device 442 includes an avalanche triggering diode 408, according to embodiments. The avalanche triggering diode 408 includes a p-type anode electrically connected to the base of the first NPN BJT 412 and to the T1. The avalanche triggering diode 408 further includes an n-type cathode electrically connected to the base of the PNP bidirectional BJT 414 of the bidirectional SCR 404, through a third resistor R3. When the bidirectional protection device 440 receives a negative transient electrical signal at the T1 relative to the T2, the avalanche triggering diode 408 is activated, thereby supplying electrons to the bidirectional SCR 404 through the base of the PNP bidirectional BJT 414, which in turn accelerates the activation of the bidirectional SCR 404 into a low impedance state, as discussed above in connection with FIG. 3A.

FIG. 4C illustrates a bidirectional protection device 460 in which the triggering device 462 includes an NPN triggering BJT 410, according to embodiments. The NPN triggering BJT 410 includes a base electrically connected to the base of the first NPN BJT 412 and to the T1 through a sixth resistor R6, and further includes an emitter electrically connected to the emitter of the first NPN BJT 412 and to the T1 through a first resistor R1. The NPN triggering BJT 406 further includes a collector connected to the base of the PNP bidirectional BJT 414 of the bidirectional SCR 404 through a third resistor R3. When the bidirectional protection device 460 receives a negative transient electrical signal at the T1 relative to the T2, the NPN triggering BJT 410 is activated, thereby supplying electrons to the bidirectional SCR 404 through the base of the PNP bidirectional BJT 414, which in turn accelerates the activation of the bidirectional SCR 404 into a low impedance state, as discussed above in connection with FIG. 3A.

Figure 5:
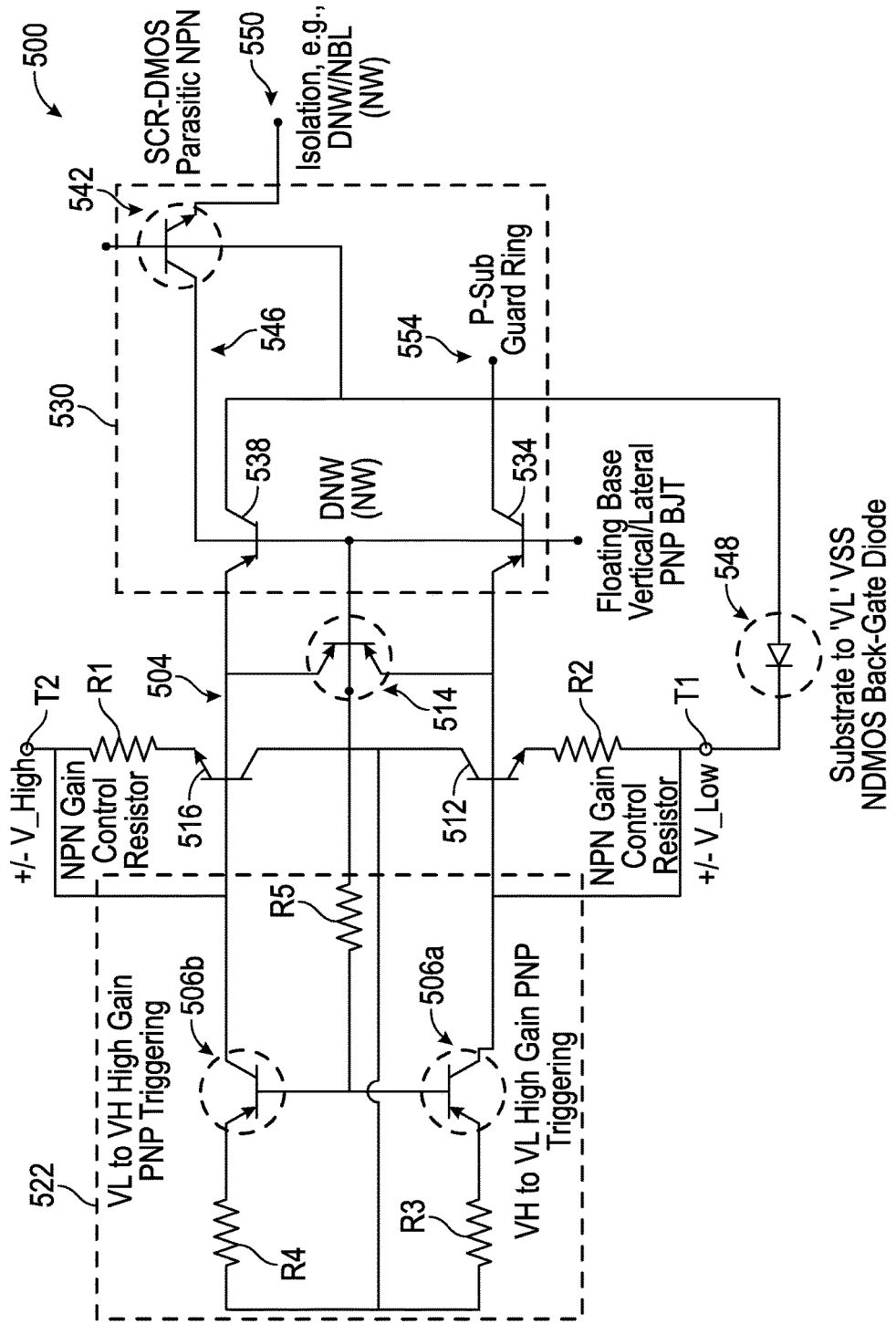
FIG. 5 is a schematic circuit diagram of a bidirectional protection device having a plurality of PNP bipolar junction transistor-based triggering devices and a gain-controlled bidirectional SCR, according to embodiments.

FIG. 5 is a schematic circuit diagrams illustrating a bidirectional protection device 500 having a plurality of PNP bipolar junction transistor-based triggering devices and a gain-controlled bidirectional triggering device, according to some embodiments. FIG. 5 shows, in addition to the protection device circuitry, surrounding circuitry that can be present in some embodiments.

The bidirectional protection device 500 includes a bidirectional SCR 504 that similar to the bidirectional SCR 404 of FIG. 4A, and includes a first NPN BJT 512, a PNP bidirectional BJT 514 and a second NPN BJT 516. The bidirectional SCR 504 is electrically connected to the R1, R2, T1 and T2 in an analogous manner to the bidirectional SCR 404 of FIG. 4A, and a detailed description of similar electrical connections is omitted.

Also similar to the bidirectional protection device 420 of FIG. 4A, the bidirectional protection device 500 includes a triggering device 522 includes a first PNP triggering BJT 506a, according to embodiments. The first PNP triggering BJT 506a is electrically connected to the first NPN BJT 512, T1, R5, the bidirectional BJT 514 and R3 in an analogous manner to the triggering device 422 of FIG. 4A, and a detailed description of similar electrical connections is omitted. In addition to the first PNP triggering BJT 506a, the bidirectional protection device 500 additionally includes a second PNP triggering BJT 506b. The second PNP triggering BJT 506b includes a collector electrically connected to the base of the second NPN BJT 516 and to the T2, and further includes a base electrically connected to the base of the PNP bidirectional BJT 514 of the bidirectional SCR 504 through the R5. The emitter of the second PNP triggering BJT 506b is electrically connected to the bidirectional SCR 514 through a fourth resistor R4.

In operation, when the bidirectional protection device 520 receives a negative transient electrical signal between the T1 and T2 what exceeds a certain value, the first PNP triggering BJT 506a may be activated and supply electrons to the bidirectional SCR 404 through the base of the bidirectional BJT 514, which at least partially causes the activation of the bidirectional SCR 504 into a low impedance state, as discussed above in connection with FIG. 3A. Analogously, when the bidirectional protection device 520 receives a positive transient electrical signal between the T1 and T2 that exceeds a certain value, the second PNP triggering BJT 506b may be activated and supply electrons to the bidirectional SCR 504 through the base of the PNP bidirectional BJT 514, which at least partially causes the activation of the bidirectional SCR 504 into a low impedance state. While in some embodiments, the first PNP BJT 506a, the second PNP BJT 506b and the bidirectional SCR 514 may be configured such that the absolute voltages sufficient to activate the bidirectional protection device 520 may be similar or the same in opposite polarities, in other embodiments they may be configured such that the absolute voltages sufficient to activate the bidirectional protection device 520 may be different in opposite polarities, depending on the application.

Now referring to the surrounding circuitry of the bidirectional protection device 500, a parasitic circuit 530 electrically connected to the bidirectional SCR 504 may be present. The parasitic circuit 530 includes a first parasitic PNP BJT 534 and a second parasitic PNP BJT 538, each having a base commonly connected to the base of the PNP bidirectional BJT 514. In addition, the first and second parasitic PNP BJTs 534 and 538 have emitters electrically connected to the C/E and E/C of the bidirectional BJT 514, respectively. The collector of the first parasitic PNP BJT can be connected to a substrate region 554, e.g., a guard-ring structure formed in the substrate. The bases of the first and second parasitic PNP BJTs 534 and 538 are commonly connected to a first NPN parasitic BJT 542, whose emitter can be connected to, e.g., an isolation region 550, such as a native buried layer or a deep N well.

It will be appreciated that in the parasitic circuit 530, the collector of the first NPN parasitic BJT 542 and the base of the second PNP parasitic BJT 538 will are connected to each other, and the collector of the second PNP parasitic BJT and 538 and the base of the first NPN parasitic BJT 542 are connected to each other such that, the first NPN parasitic BJT 542 and the second PNP parasitic BJT 538 form a cross-coupled parasitic PNPN SCR 546. The parasitic SCR 546 can arise from structures such as isolation structures (e.g., a native-doped buried layer or a deep N well) and substrate regions and can be undesirable. Accordingly, the structures that give rise to the parasitic PNPN SCR 546 may be configured such that they do not become activated in operation. Still referring to FIG. 5, the bidirectional protection device 500 may have a back-gate diode 548, which can be electrically connected to the substrate region 554 and to the T1.

Figure 6A:
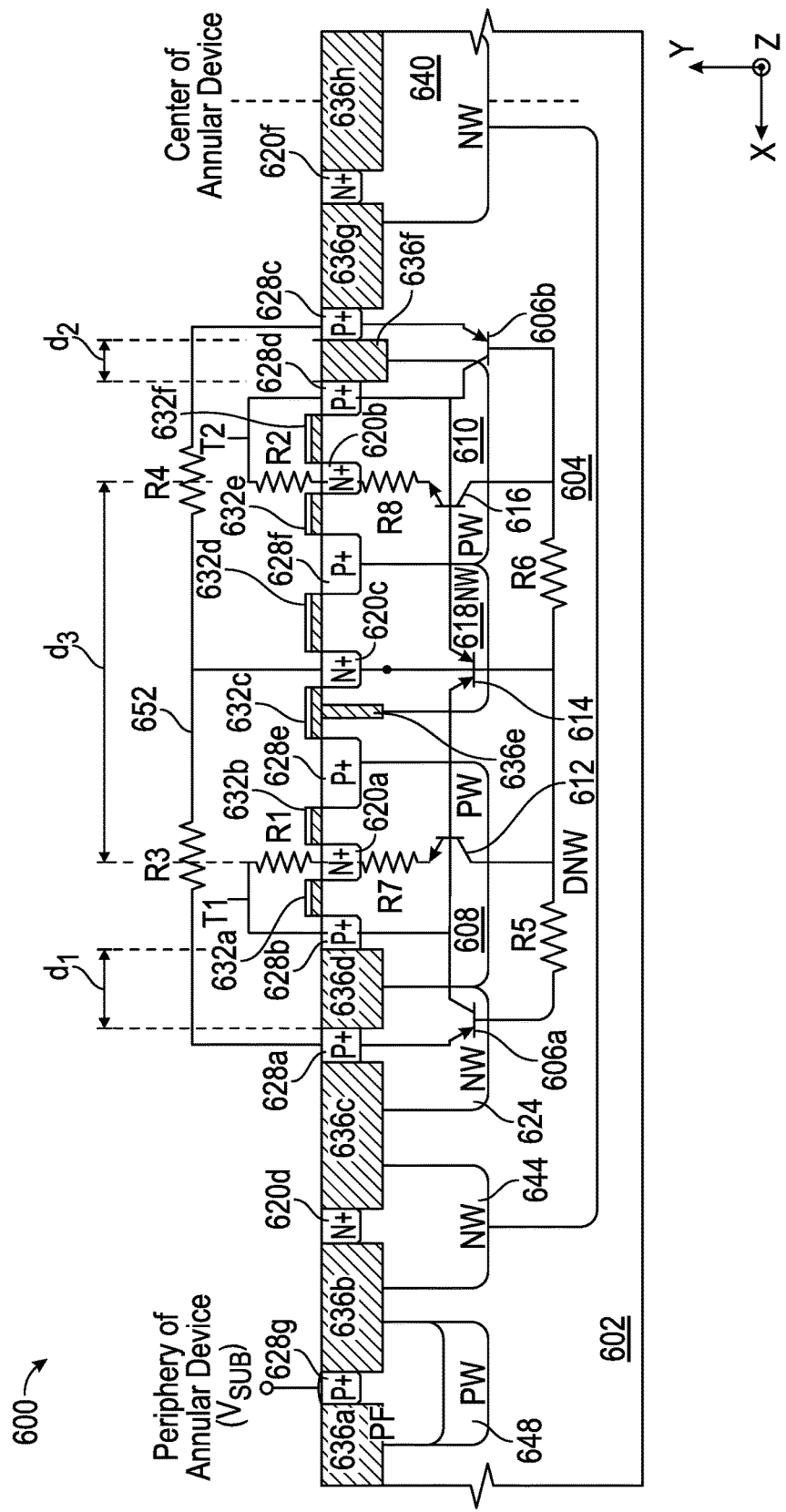
FIGS. 6A and 6B are schematic cross-sectional and top-down views, respectively, of a bidirectional protection device having a triggering device and a gain-controlled bidirectional SCR, according to embodiments.
Figure 6B:
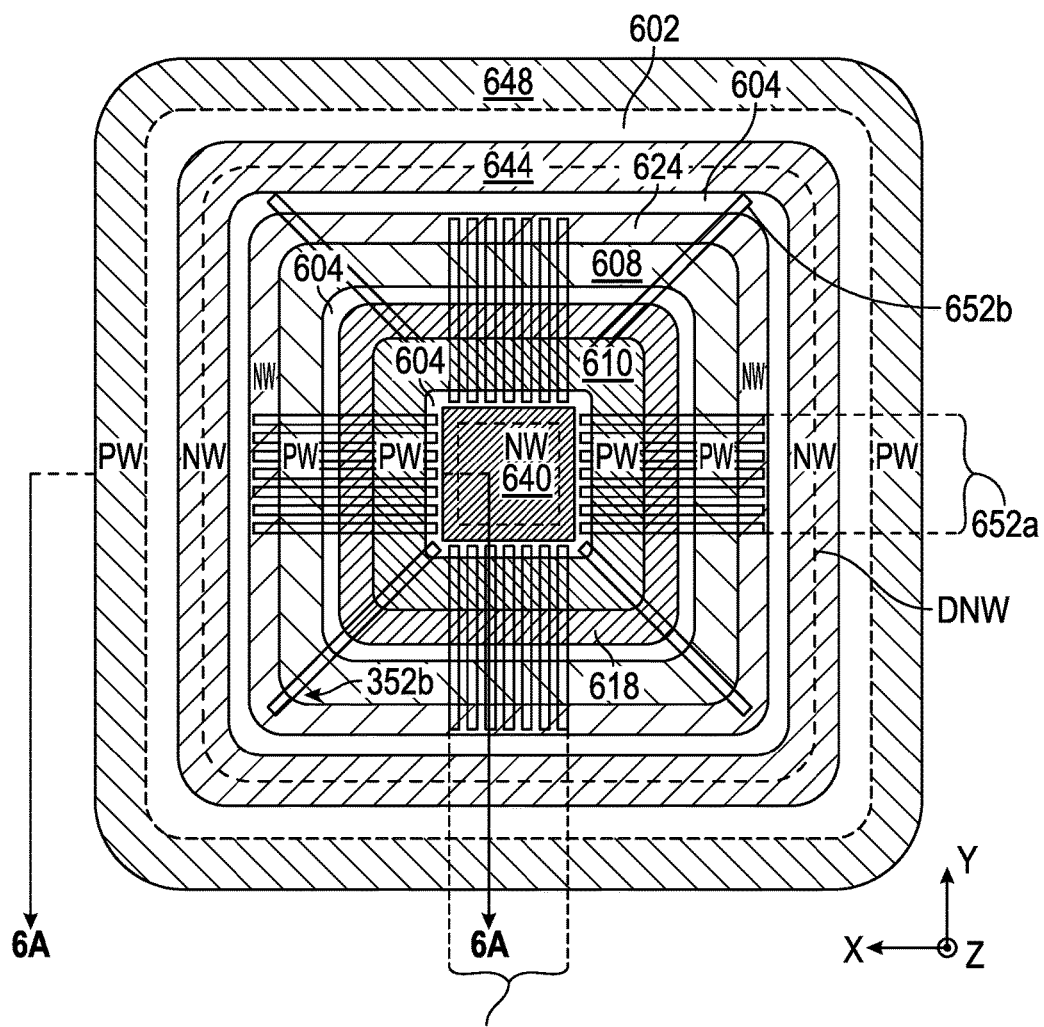

FIGS. 6A and 6B are a cross-sectional top down views, respectively, of a bidirectional protection device 600 having an integrated triggering device, according to some embodiments. The illustrated embodiment is an annular device in which various regions formed in the substrate surround a center region of the annular device, in which FIG. 6A shows a cross section taken along one half of the annular device.

In FIG. 6A, to help better understand the various structural features as they relate to the operation bidirectional protection device 600, various structural regions are overlaid with an equivalent circuit diagram. In the following, the various structural features are described first, followed by the corresponding equivalent circuit diagram. The bidirectional protection device 600 includes a semiconductor substrate 602, e.g., a p-type semiconductor substrate, having formed therein a first n-type well (NW) 618 interposed between a first p-type well (PW) 608 and a second p-type well (PW) 610. The first PW 608 has formed therein a first heavily doped n-type (n+) region 620a region that is electrically connected to a first terminal T1 and the second PW 610 has formed therein a second heavily doped n-type (n+) region 620b electrically connected to a second terminal (T2), such that a bidirectional semiconductor-controlled rectifier (SCR) is formed, where the bidirectional SCR has the first n+ region serving as a cathode/anode (K/A) and the second n+ region serves as an anode/cathode (A/K).

As described herein and throughout the specification, it will be appreciated that the semiconductor substrate 602 can be implemented in a variety of ways, including, but not limited to, a doped semiconductor substrate or a silicon on insulator (SOI) substrate including a silicon-insulator-silicon structure in which the various structures described above are isolated from a support substrate using an insulator layer such as a buried $SiO_2$ layer. In addition, it will be appreciated that the various structures described above can be at least partially formed in an epitaxial layer formed at or near a surface region.

In the illustrated embodiment, first PW 608 is laterally separated from the first NW 618 by a gap, while the second PW 610 contacts the first NW 618 to form a junction therebetween. However, other embodiments are possible, e.g., where the first PW 608 and the first NW 618 can contact each other to form a junction therebetween, and/or where the second PW 610 and the first NW 618 is separated, depending on the desired device characteristics, as discussed more in detail infra.

As used herein, a junction or a junction region refers to a region formed when two semiconductor material of different types form an interface, and can include regions near the interface where the electronic bands (i.e., conduction and valence bands) are bent due to built-in electric fields. Thus, the dimension of a junction region can depend on various factors such as the doping concentrations and the doping profiles of the different types of semiconductor materials forming the junction.

Still referring to FIG. 6, the bidirectional protection device 600 includes a deep N well (DNW) 604 disposed below, e.g., immediately below or in contact with bottom ends of one or more of the first NW 618, the first PW 608 and the second PW 610. In some embodiments, the DNW 604 forms junction regions with the first and second PWs 608, 610 vertically in the y direction while forming a vertical extension of an n-type region from the first NW 618. In embodiments where the first PW 608 and the first NW 618 are laterally separated from each other, and/or where the second PW 610 and the first NW 618 are laterally separated from each other, the DNW 604 can fill the respective gap formed between separated regions. For example, in FIG. 6A, the first PW 608 and the first NW 618 are separated by the DNW 604 such that the DNW 604 can also form a lateral extension region from the first NW 618.

Still referring to FIG. 6A, the first n+ region 620a, the first PW 608, the first NW 618, the second PW 610 and the second n+ region 620b are electrically connected such that an NPNPN bidirectional SCR is formed. The bidirectional SCR includes a first PNP bidirectional BJT 614, a first NPN BJT 612 and a second NPN BJT 616 that are electrically connected in an analogous manner to the PNP bidirectional BJT 514, the first NPN BJT 512 and the second NPN BJT 516 described above with respect to FIG. 5.

Still referring to FIG. 6A, the bidirectional protection device 600 further comprises a second n-type well (NW) 624 adjacent the first PW 608. The second NW 624 has formed therein a first heavily doped p-type (p+) region 628a. The first p+ region 628a, the second NW 624 and the first PW 608 are configured as an emitter, a base and a collector of a first triggering PNP BJT 606a. The first PW 608 has formed therein a second heavily doped p+ region 628b, through which the collector of the first triggering PNP BJT 606a is electrically connected to the T1, such that the collector of the first triggering PNP BJT 606a is commonly electrically connected to the T1 with the first n+ region 620a configured as the cathode/anode (K/A) of the bidirectional SCR of the bidirectional protection device 600.

The bidirectional protection device 600 is configured such that the second PW 610 is interposed between the first NW 618 on a first side and the DNW 604 on a second side and in contact therewith. The DNW 604 has formed therein a third heavily doped p-type (p+) region 628c. The third p+ region 628c, the DNW 604 and the second PW 618 are configured as an emitter, a base and a collector of a second triggering PNP BJT 606b. The second PW 610 has formed therein a fourth heavily doped p+ region 628d, through which the collector of the second triggering PNP BJT 606b is electrically connected to the T2, such that the collector of second triggering PNP BJT 606b is commonly electrically connected to the T2 with the second n+ region 620b configured as the anode/cathode (A/K) of the bidirectional SCR of the bidirectional protection device 600.

In the bidirectional protection device 600, while the second p+ region 628b is directly electrically connected to the T1, the first n+ region 620a is electrically connected to the T1 through a first resistor R1. Similarly, while the fourth p+ region 628d is directly electrically connected to the T2, the second n+ region 620b is electrically connected to the T2 through a second resistor R2. R1 and R2 have resistance values such that as connected to the emitters of the first NPN BJT 612 and the second NPN BJT 616, respectively, the emitter injection efficiency and corresponding gains of the respective BJT's can be controllably reduced, thereby increasing the holding voltages of the NPNPN bidirectional SCR, as described supra with respect to FIG. 3C. R1 and R2 are formed above the bidirectional protection device 600 by patterning one or more metallization levels, e.g., first (M1) through $n^{th}$ (Mn) metallization levels, where n can be 2 to 10. Each of the R1 and R2 can be formed of one or more of patterned polysilicon or patterned thin-film metal layers.

The first triggering PNP BJT 606a and the second triggering PNP BJT 606b are further configured such that the respective emitters are electrically connected to the first NW 618 through one or more metallization levels formed above the bidirectional protection device 600. In the illustrated embodiment, the first p+ region 628a is electrically connected to a third heavily doped (n+) region 620c formed in the first NW 618, which can be disposed at a central region of the NPNPN bidirectional SCR, through a third resistor R3 formed at one or more of the metallization levels 652. Analogously, the third p+ region 628c is electrically connected to the third heavily doped (n+) region 620c formed in the first NW 618 through a fourth resistor R4 formed at the one or more of the metallization levels 652. In various embodiments, each of the R3 and R4 has a resistance value between about 0.01 Ohm and about 2000 Ohms, for instance 0.05 about Ohms. Each of the R3 and R4 can be formed of one or more of patterned polysilicon or patterned thin-film metal layers.

Thus, the bidirectional protection device 600 includes: an NPNPN bidirectional SCR including the first n+ region 620a, the first PW 608, the first NW 618, the second PW 610 and the second n+ region 620b; a first triggering device comprising the first triggering PNP BJT 606a including the first p+ region 628a, the second NW 624 and the first PW 608; and a second triggering device comprising the second triggering PNP BJT 606b including the third p+ region 628c, the DNW 604 and the second PW 610. By having the emitters of the first and second triggering BJTs 606a and 606b electrically connected to the NPNPN bidirectional SCR through the first NW 618 to provide electrons thereto upon being activated, the NPNPN bidirectional SCR and the first and second triggering devices operate analogously to the bidirectional SCR 504 and the triggering device 522 described above with respect to FIG. 5.

Referring now to FIG. 6B in conjunction with FIG. 6A, the annular configuration of the bidirectional protection device 600 is described. The bidirectional protection device 600 has a third n-type well (NW) 640 disposed at the center of the annular configuration and has formed therein a sixth heavily doped n-type (n+) region 620f. The third NW 640 is successively surrounded by the second PW 610, first NW 618, the first PW 608, the second NW 624, a fourth n-type well (NW) 644 having formed therein a fourth heavily doped n-type (n+) region 620d and a third p-type well (PW) 648 having formed therein a seventh heavily doped p-type (p+) region 628g. The seventh p+ region 628g may be electrically connected, e.g., Kelvin-connected, to the substrate of the main circuitry at $V_{SUB}$, which may be at ground.

It will be appreciated that the third NW 640, the DNW 604 and the fourth NW 644 form a tub-type isolation region laterally and vertically enclosing the first PW 608, the second PW 610, the first NW 618 and the second NW 624. In some embodiments, the tub-type isolation may be electrically floated.

As discussed above, the first and second first trigger PNP BJTs 606a and 606b are electrically connected to the first NW 618 through R3 and R4 formed at one or more of the metallization levels 652. The metallization process architecture of the bidirectional protection device 600 includes a plurality of metallization levels, e.g., first (M1) through $n^{th}$ (Mn) metallization levels, where n can be 2 to 10. As used herein, a metallization level includes laterally extending conductive structures formed of conductive materials, e.g., Cu, Al or W, such as metal lines, that can be patterned using a lithography mask, and also includes vertically extending conductive structures such as vias or contacts formed of conductive materials such as, e.g., Cu, Al or W, that are immediately below the laterally extending conductive structures. Thus, the first metallization level 404 includes the lowest level metal lines above the substrate 602 and vias or contacts made to an n+ or a p+ region (e.g., self-aligned silicide or "salicided" contacts), within a PW or an NW. Similarly, M2 includes next higher level of metal lines above the M1 and vias or contacts made to the M1. M3 to Mn are similarly defined herein to include both lateral lines and vertical connections below them.

In the top down illustration of FIG. 6B, the one or more metallization levels 652 of FIG. 6A are formed of a plurality of metal strips 652*a*/*b* extending radially and electrically connected to the second NW 624 through the first p+ region 628*a*, to the first NW 618 through the third n+ region 620*c* and to the DNW 604 through the third p+ region 628*c*, as illustrated in FIGS. 6A/6B. In some embodiments, the metal strips 652*a*/*b* are advantageously formed at metal levels below M3, i.e., at metallization levels M1 and/or M2, to minimize the resulting net capacitance while targeting the resistance values of R3 and R4 described above, such that RC delay is minimized to deliver the triggering carriers to the first NW 618. For example, the dimensions and the spacing between adjacent metal strips 652*a*/652*b* can be designed such that a net capacitance is lower than about 100 fF, lower than about 50 fF or lower than about 30 fF. In addition, it will be appreciated that the number of the metal strips 652*a*/652*b* can be optimized. For example, while 28 (7 per side) metal strips 652*a* and 4 metal strips 652*b* are illustrated in FIG. 6B, different arrangements are possible, where there are more or less numbers of the metal strips 652*a*/*b* such that the net resistance value of each of R3 and R4 is between about 0.001 Ohms and about 20 Ohms, between for instance 0.05 Ohms.

With continued reference to FIG. 6A, the bidirectional protection device 600 includes plurality of electrically floating metal layers extending laterally in the x-direction and separating some of the adjacent heavily doped (n+ and p+) regions: a first electrically floating metal layer 632*a* formed on a surface of the first PW 608 and between the second p$^+$ region 628*b* and the first n$^+$ region 620*a*; a second electrically floating metal layer 632*b* formed on the surface of the first PW 608 and between the first n$^+$ region 620*a* and a fifth p$^+$ region 628*e*; a third electrically floating metal layer 632*c* formed on a surface of a junction region between the first NW 618 and the DNW 604 and between the fifth p$^+$ region 628*e* and the third n$^+$ region 620*c*; a fourth electrically floating metal layer 632*d* formed on the surface of the first NW 618 and between the third n$^+$ region 620*c* and a sixth p$^+$ region 628*f*; a fifth electrically floating metal layer 632*e* formed on a surface of the second PW 610 and between the sixth p$^+$ region 628*f* and the second n$^+$ region 620*b*; and a sixth electrically floating metal layer 632*f* formed on the surface of the second PW 610 and between the second n$^+$ region 620*b* and the fourth p$^+$ region 628*d*. The electrically floating metal layers are electrically floating because they are not electrically connected to other structures and are separated from the surfaces on which they are formed by a thin dielectric layer. Without being bound to any theory, it will be appreciated that the floating metal layers can allow placement of oppositely doped adjacent n+ and p+ regions at relatively close lateral proximity for high current (e.g., >1×10$^5$ A/cm$^2$) capability of the devices formed by the n+ and/or p+ regions with improved breakdown characteristics therebetween, e.g., due to band-to-band tunneling and/or punch-through effects. This in turn allows for optimization of various BJTs of the bidirectional SCR device for relatively high current and high speed capability, e.g., by enabling shorter base regions of the first NPN BJT 612, second NPN BJT 616 and the bidirectional PNP BJT 614 for optimum transistor efficiency.

Advantageously, the first to sixth electrically floating metal layers 632*a* to 632*f* can be formed simultaneously during and using processing steps that form gate stacks of n-FETs (not shown) or p-FETs (not shown) elsewhere in the apparatus (e.g., a core circuit) that is electrically connected to the bidirectional protection device 600. Accordingly, in various embodiments described herein, the floating metal layers are formed on underlying thin dielectrics (e.g., SiO$_2$, SiON, or high K dielectrics) that are deposited or grown to form gate dielectrics (not shown) of the n-FETs and/or p-FETs elsewhere in the integrated circuit. Thus, while not depicted in the Figures for clarity, the floating metal layers do not directly contact the underlying surfaces of the wells on which they are formed, but are vertically interposed by a thin dielectric. In addition, while also not illustrated for clarity, sidewall spacers (e.g., SiN spacers) may be formed on sidewalls of the floating metal layers to insulate the floating metal layers from contacting the adjacent n$^+$ and p$^+$ regions. The underlying gate dielectric layer and sidewall spacers prevent a direct electrical short from forming between adjacent n$^+$ and p$^+$ regions. The thin dielectric layers prevent a silicide formation between the floating metal layers and the underlying well surfaces, and serve to electrically isolate the floating metal layers, which are not electrically connected to any other structure.

When the metal layers are formed with the gates of n-FETs, material that can be used include n-doped semiconductors such as n-doped polycrystalline silicon or a suitable "n-type" metal having a work function $\Phi_{m,N}$ between about 4.1 eV and about 4.65 eV, between about 4.1 eV and about 4.4 eV, or between about 4.4 eV and about 4.65 eV. When the metal layers are formed with gates of p-FETs, materials that can be used include p-doped semiconductors such as p-doped polycrystalline silicon or a suitable "p-type" metal having a work function $\Phi_{m,P}$ between about 4.65 eV and about 5.2 eV, between about 4.65 eV and about 4.9 eV, or between about 4.9 eV and about 5.2 eV.

In various embodiments disclosed herein, suitable metals for the electrically floating metal layers 632*a*-632*f* in FIG. 6A include, e.g., aluminum (Al), tungsten (W), titanium (Ti), tantalum (Ta), molybdenum (Mo), rubidium (Ru), TiN, TaN, TaCN, and TaSi$_x$N$_y$, to name a few.

It will be appreciated that the lateral dimensions of each of the electrically floating metal layers 632*a*-632*f* are less than about 1 μm, less than about 0.5 μm, less than about 0.2 μm, between about 0.1 μm and about 0.3 μm, or between about 0.06 μm and about 0.2 μm, for instance about 0.16 μm.

Some other adjacent heavily doped (p+ and n+) regions of the bidirectional protection device 600 that are not separated by an electrically floating metal layer may be separated by one of first to eighth dielectric isolations 636*a*-636*h*, which can be shallow trench isolation regions. Similar to floating metal layers, dielectric isolations can allow placement of oppositely doped adjacent n+ and p+ regions at relatively close lateral proximity for high current capability. Compared to the floating metal layers, however, dielectric isolation regions can allow for optimization of various BJTs of the bidirectional SCR device for relatively lower speed, e.g., by enabling a longer path length between the adjacent n+ and p+ regions, e.g., a longer path length of the base regions of some BJTs.

Yet some other adjacent heavily doped (n+, p+) regions are separated by both an electrically floating metal layer in addition to a dielectric isolation to provide additional breakdown voltage between adjacent junctions at the expense of longer carrier drift path. For example, the fifth p+ region 628e and the third n+ region 620c are separated by the third electrically floating metal layer 632c and a fifth dielectric isolation 636e. In the illustrated implementation, the fifth dielectric isolation 636e increases the breakdown voltage of the junction between the DNW 604 and the first NW while increasing in the effective base length of the PNP bidirectional BJT 614, such that the triggering voltage of the bidirectional SCR under a positively biased T1 relative to the T2 can be increased in exchange for slower speed.

Various p+ regions and n+ region disclosed herein can have a peak doping concentration exceeding about $1\times10^{19}$ $cm^{-3}$, exceeding about $1\times10^{20}$ $cm^{-3}$, or in the range between about $1\times10^{20}$ $cm^{-3}$ and about $8\times10^{20}$ $cm^{-3}$, for example, about $2\times10^{20}$ $cm^{-3}$. In addition, various PWs and NWs and the DNW have a peak doping concentration in the range of about $1.5\times10^{16}$ $cm^{-3}$ to about $7.5\times10^{16}$ $cm^{-3}$, for example, about $5.0\times10^{16}$ $cm^{-3}$.

By using a combination of dielectric isolation regions, floating metal layers and optimized lateral dimensions between various structures, the triggering devices and the bidirectional SCR of the bidirectional protection device 600 can be optimized to operate as described above with respect to FIGS. 4A and 5. For example, the fourth dielectric isolation 636d has a lateral length d1 in the x-direction and the sixth dielectric isolation 636f has a lateral length d2 in the x-direction, whose dimensions can be tailored to optimize the first and second triggering PNP BJTs 606a and 606b to be relatively short compared to the lateral dimension d3 of the NPNPN bidirectional SCR, which is the distance between the first n+ region 620a and second n+ region 620b, such that the triggering PNP BJTs 606a and 606b are configured to be activated prior to the activation of the bidirectional SCR, as described above with respect to FIGS. 4A and 5. In various embodiments, each of d1 and d2 are between about 1 µm and about 5 µm, between 2 µm and 4 µm, for instance about 3 µm, while d3 is between about 10 µm and about 30 µm, between about 15 µm and about 25 µm, for instance about 20 µm. In some embodiments, the each of ratios d3/d1 and d3/d2 is between about 3:1 and about 7:1, between about 4:1 and about 6:1, for instance about 5:1.

FIGS. 7A-7L are cross-sectional illustrations of various embodiments of bidirectional protection devices in which various regions are optimized for speed, current, and/or holding voltage, among other parameters, as described below.

Each of the bidirectional protection devices 7a-7l can be an annular device in which various regions formed in the substrate surround a center region of the annular device, similar to the annular configuration described above with respect to FIG. 6B, such that each of FIGS. 7A-7L shows a cross section taken along one half of the annular device.

Referring to FIGS. 7A-7L, each of the bidirectional protection devices 7a-7l illustrated with respect to FIGS. 7A-7L have some features that are similar to the embodiment described illustrated supra with respect to FIGS. 6A and 6B. For example, each of the bidirectional protection devices 7a-7l includes: a semiconductor substrate 602, having formed therein a first n-type well (NW) 618 interposed between a first p-type well (PW) 608 and a second p-type well (PW) 610; a third n-type well (NW) 640 formed at a side of the second PW 610 closer to the center of the device and having formed therein a sixth heavily doped n-type (n+) region 620f, a fourth n-type well (NW) 644 formed at a side of the first PW 612 facing away from the center of the device and having formed therein a fourth heavily doped n-type region (n+) 620d, and a DNW 604 arranged as a tub-type isolation laterally and vertically enclosing the first PW 608, the second PW 610, the first NW 618 and the second NW 624; a third p-type well (PW) 648 formed at a side of the fourth NW 644 facing away from the center of the device and having formed therein a seventh heavily doped p-type (p+) region 628g. Similar to the embodiments described above with respect to FIGS. 6A/6B, each of the bidirectional protection devices 7a-7l has a fifth p+ region 628e formed at a boundary region between the first PW 608 and the DNW 604, and a sixth p+ region 628f formed at a boundary region between the first NW 618 and the second PW 610. Each of the bidirectional protection device 7a-7l also similarly has first to eighth dielectric isolation regions 636a-636h.

Referring to the bidirectional protection device 700a of FIG. 7A, similar to the embodiment of FIGS. 6A/6B, in the first PW 608, a first heavily doped n-type ($n^+$) region 620a electrically connected to a first terminal (T1) through a first resistor R1 is formed, and in the second PW 610, a second heavily doped n-type (n+) region 620b electrically connected to a second terminal (T2) through a second resistor R2 is formed, such that the first n+ region 620a, the first PW 608, the first NW 618, the second PW 610 and the second n+ region 620b are electrically connected such that an NPNPN bidirectional SCR is formed. The bidirectional SCR includes a first PNP bidirectional BJT 614, a first NPN BJT 612 and a second NPN BJT 616 that are electrically connected in an analogous manner to the bidirectional protection device 600 of FIGS. 6A/6B.

In the illustrated embodiment, first PW 608 is laterally separated from the first NW 618 by a gap, while the second PW 610 contacts the first NW 618 to form a junction therebetween. However, other embodiments are possible, e.g., where the first PW 608 and the first NW 618 can contact each other to form a junction therebetween, and/or where the second PW 610 and the first NW 618 is separated.

Still referring to FIG. 7A, the DNW 604, the first PW 608 and the first n+ region 620a are configured as a collector, a base and an emitter of a first triggering NPN BJT 706a. The first PW 608 has additionally formed therein a first p+ region 728a and a second p+ region 628b on each side of and commonly connected to T1, such that the base of the first triggering NPN BJT 706 and the base of the first NPN BJT 612 are commonly electrically connected to T1. In addition, the emitter of the first triggering NPN BJT 706a and the emitter of the first NPN BJT 612 are each connected to T2 though a seventh resistor R7 of the first PW 608 and the R1. While not necessary, in the illustrated embodiment, the first n+ region 620a contacts the first and second p+ regions 728a and 628b on each side.

The bidirectional protection device 700a is configured such that the second PW 610 is interposed between the first NW 618 on a first side and the DNW 604 on a second side and in contact therewith. The second n+ region 620b, the second PW 618 and the DNW 604 are configured as an emitter, a base and a collector of a second triggering NPN BJT 706b. The second PW 610 has formed therein a third p+ region 728c electrically commonly connected to the T2 with the second n+ region 620b, such that the base of the second triggering NPN BJT 706b is electrically connected to the T2. In addition, the emitter of the second triggering NPN BJT 706b and the emitter of the second NPN BJT 616 are each connected to the T2 though an eighth resistor R8 of the second PW 610 and the R2. While not necessary, in the illustrated embodiment, the second n+ region 620b contacts the third p+ region 728c.

Similar to the embodiment of FIGS. 6A/B, in the bidirectional protection device 700a, R1 and R2 have resistance values such that as connected to the emitters of the first NPN BJT 612 and the second NPN BJT 616, the gains of the respective BJT's are controllably reduced, thereby increasing the holding voltages of the NPNPN bidirectional SCR. They physical structure and the resistance values of the R1 and R2 are similar to those described above with respect to FIGS. 6A/6B.

The first and second triggering NPN BJT 706a and 706b are further configured such that the respective collector regions formed by the respective n+ regions in the DNW 604 are electrically connected to the first NW 618 through one or more metallization formed above the bidirectional protection device 600. In the illustrated embodiment, fourth and fifth n+ regions 720b and 720c formed in the DNW 604 are electrically connected to the third n+ region 620c formed in the first NW 618 through a third resistor R3 and a fourth resistor R4, each formed at one or more of the metallization levels 652, respectively. In various embodiments, each of the R3 and R4 has a structure and a resistance value similar to those described above with respect to FIGS. 6A/6B.

In addition to the first to eighth isolation regions 636a to 636h, the bidirectional protection device 700a additionally includes a ninth isolation region 736a between the first p+ region 728a and the fifth p+ region 628e, and a tenth isolation region 736b between the sixth p+/PLDD region 628f and the second n+ region 620b. When present, the ninth isolation region 736a and the tenth isolation region 736b can have the effects of, among other things, increasing base lengths of the first NPN BJT 612 and the second NPN BJT 610, respectively such that their gains are controllably reduced.

Thus, the bidirectional protection device 700a includes: an NPNPN bidirectional SCR which includes the first n+ region 620a, the first PW 608, the first NW 618, the second PW 610 and the second n+ region 620b; a first triggering device comprising the first triggering NPN BJT 706a formed by the DNW 604, the first PW 612 and the first n+ region 720a; and a second triggering device comprising the second triggering NPN BJT 706b formed by the second n+ region 620b, the second PW 610 and the DNW 604. By having the emitters of the first and second triggering NPN BJTs 706a and 706b electrically connected to the NPNPN bidirectional SCR through the first NW 618 to provide electrons thereto upon being activated, each pair of the NPNPN bidirectional SCR and the first and second triggering devices operates analogously to the bidirectional SCR 404 and the triggering device 462 described above with respect to FIG. 4C.

Still referring to FIG. 7A, under certain configurations, the regions that form the first triggering NPN BJT 706a and/or the regions that form the second triggering NPN BJT 706b have physical characteristics such that the resulting first and/or second triggering devices behave essentially as avalanche diodes. In particular, when a current path length between the fourth n+ region 720b and the second p+ region 628b as measured, e.g., by the width of the fourth dielectric isolation 636d is, e.g., less than 5 μm, less than 3.5 μm or less 2 μm, the resulting triggering device is configured such that, when the T1 is negatively biased relative to the T2, the fourth n+ region 720b, the DNW, the first PW 608 and the second p+ region 628b are configured to serve an n$^+$p avalanche diode 706a. Similarly, when a current path length between the fifth n+ region 720c and the third p+ region 728c is, e.g., less than 5 μm, less than 3.5 μm or less 2 μm, the resulting triggering device is configured such that, when the T2 is negatively biased relative to the T1, the fifth n+ region 720c, the DNW, the second PW 612 and the third p+ region 728c are configured to serve an n$^+$p avalanche diode 706b.

Figures 7C, 7D:
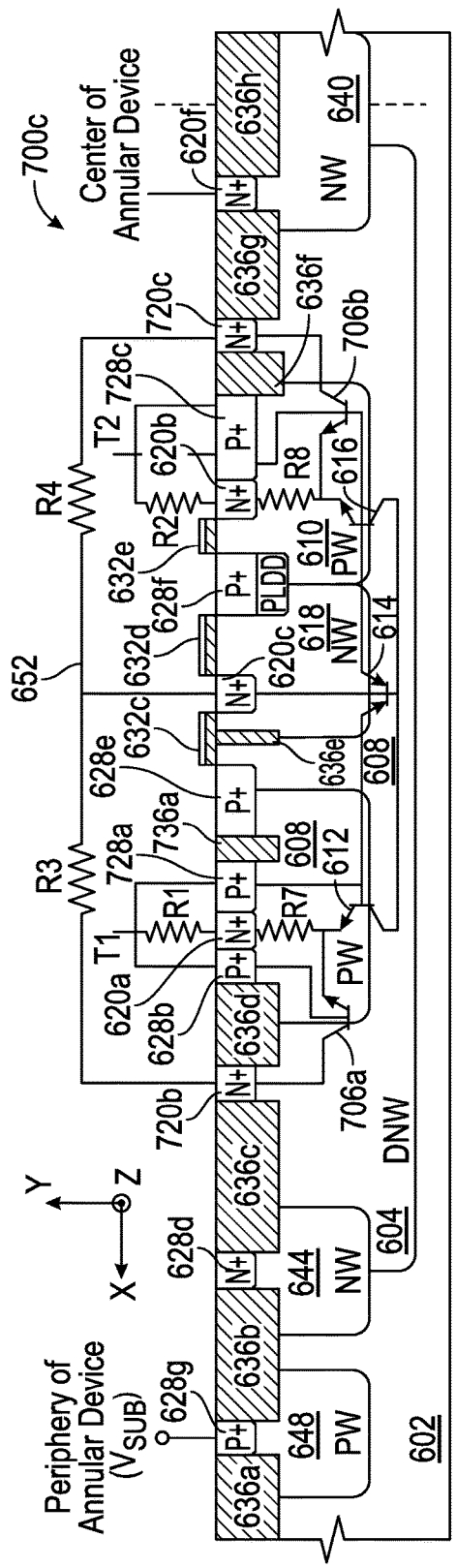
Figure 7E:
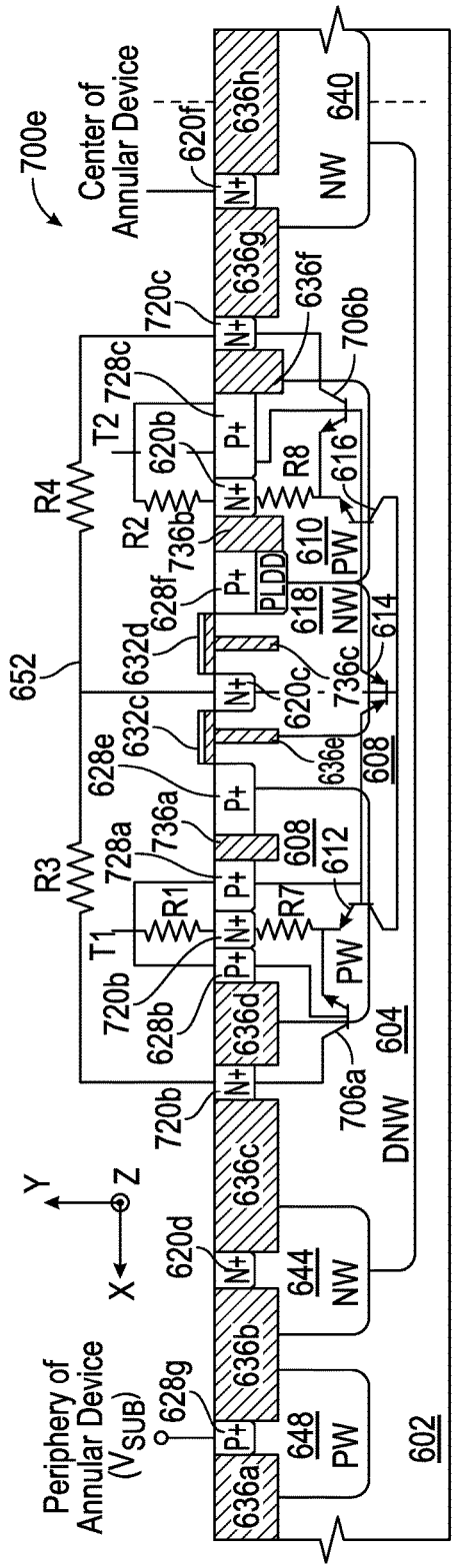
Figure 7F:
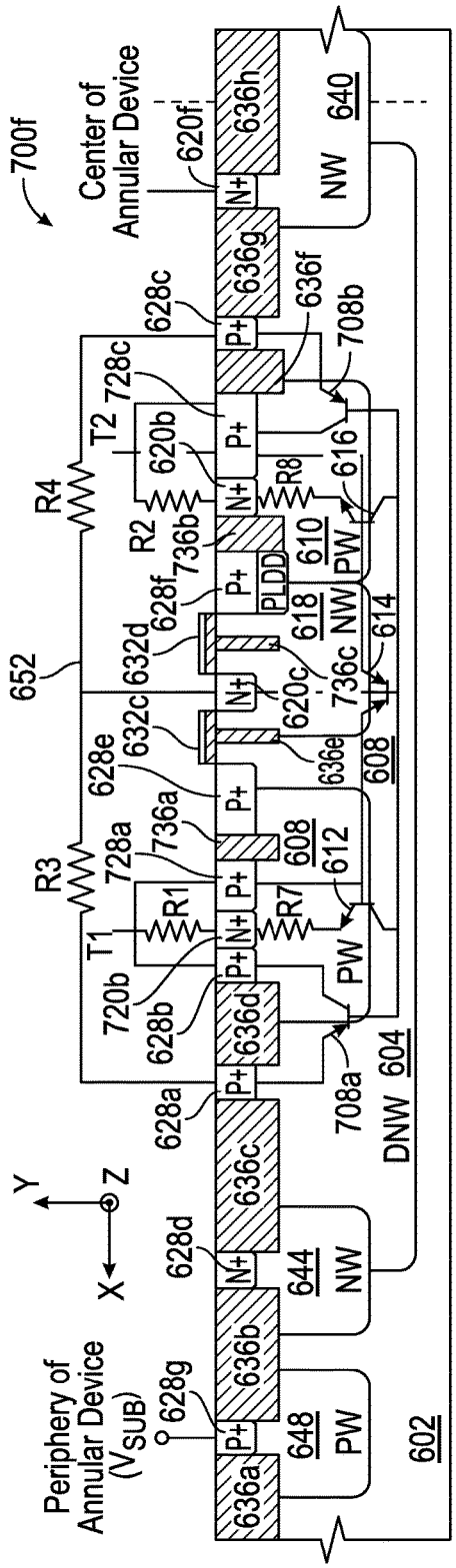
Figure 7G:
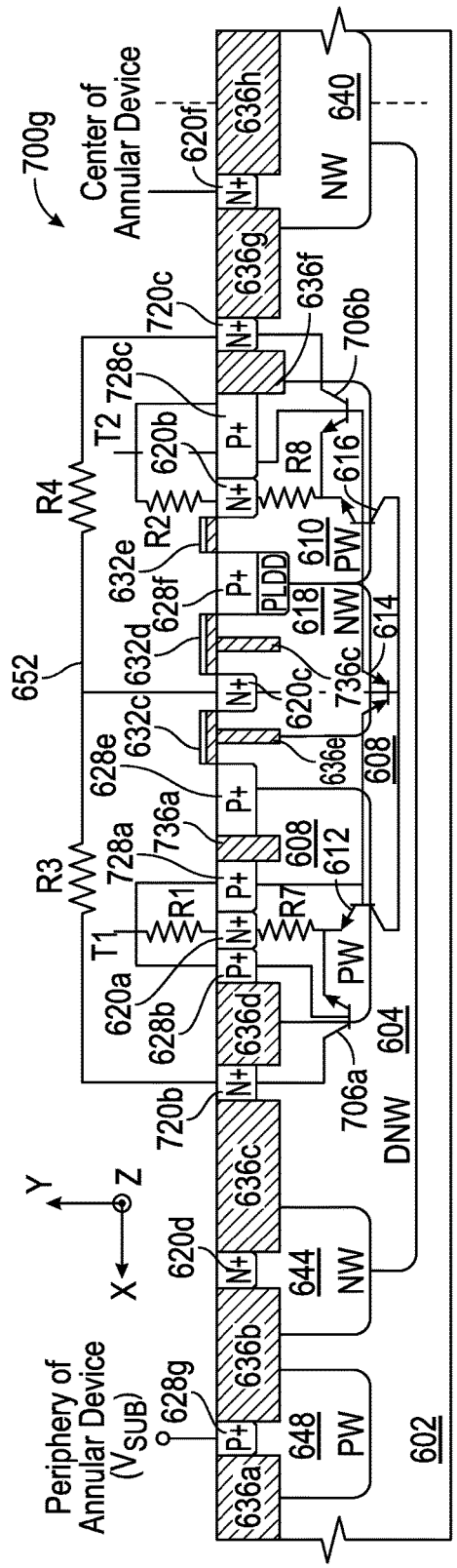
Figure 7H:
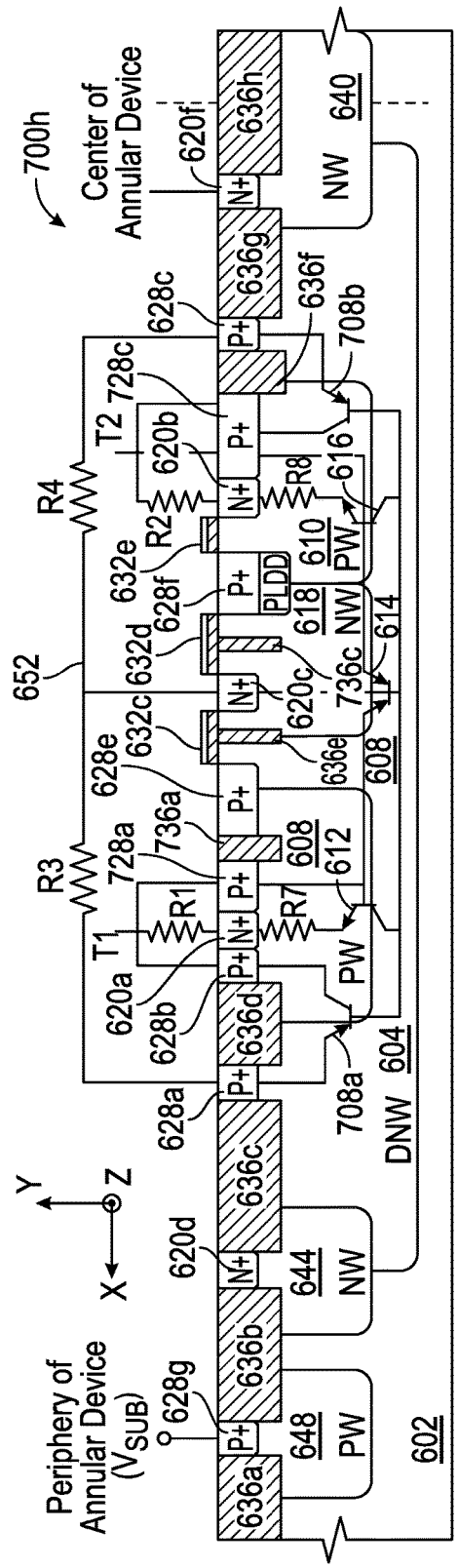
Figure 7I:
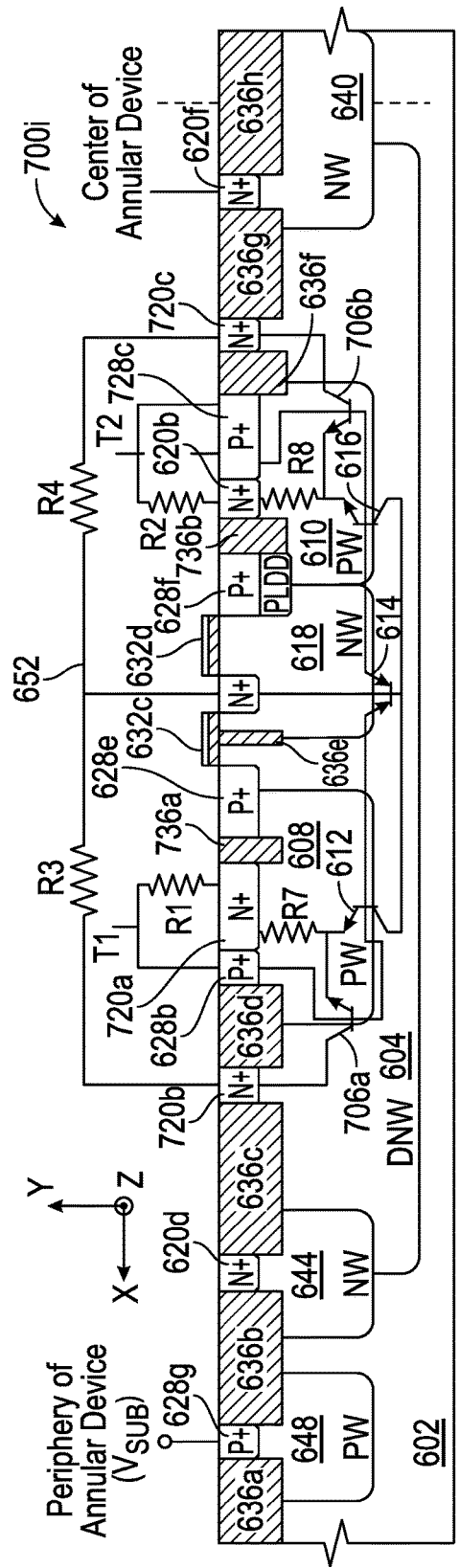
Figure 7J:
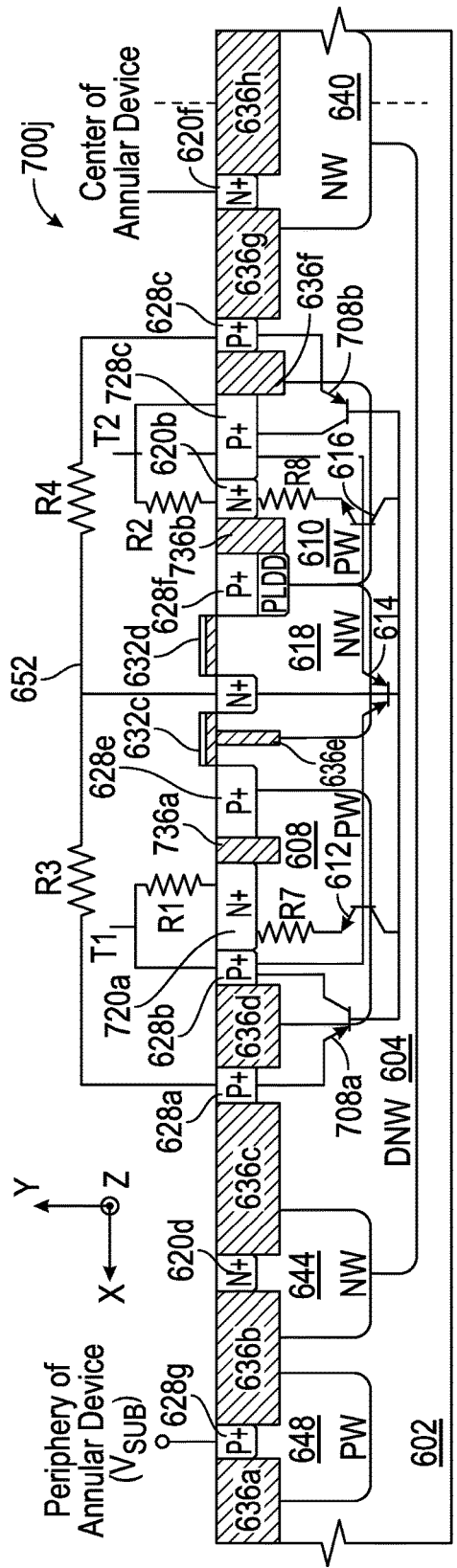
Figure 7K:
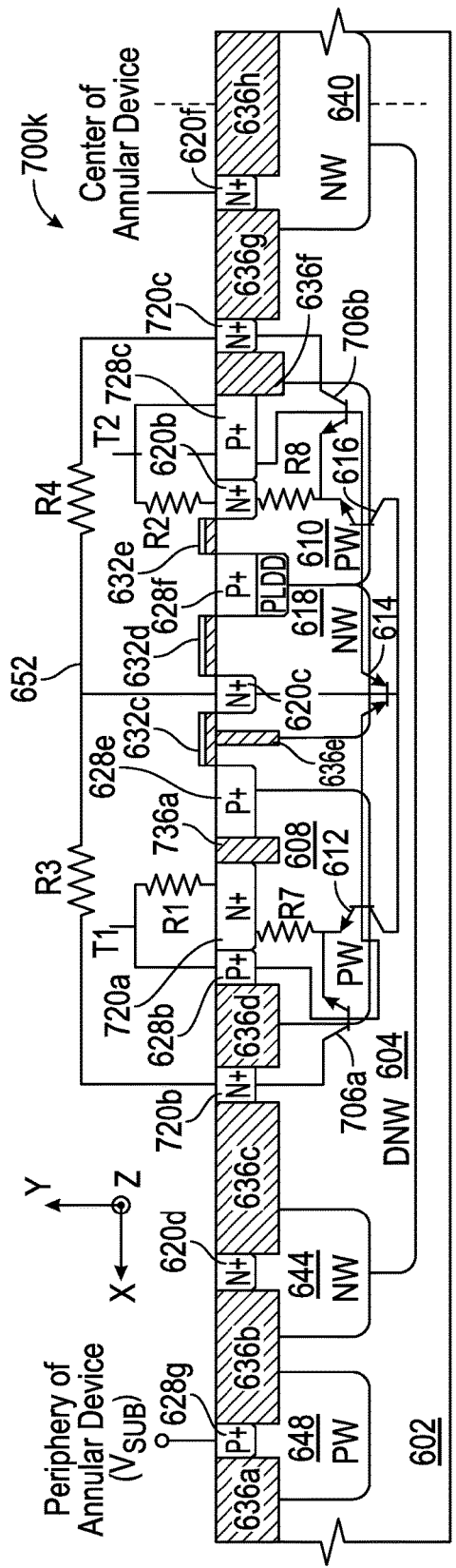
Figure 7L:
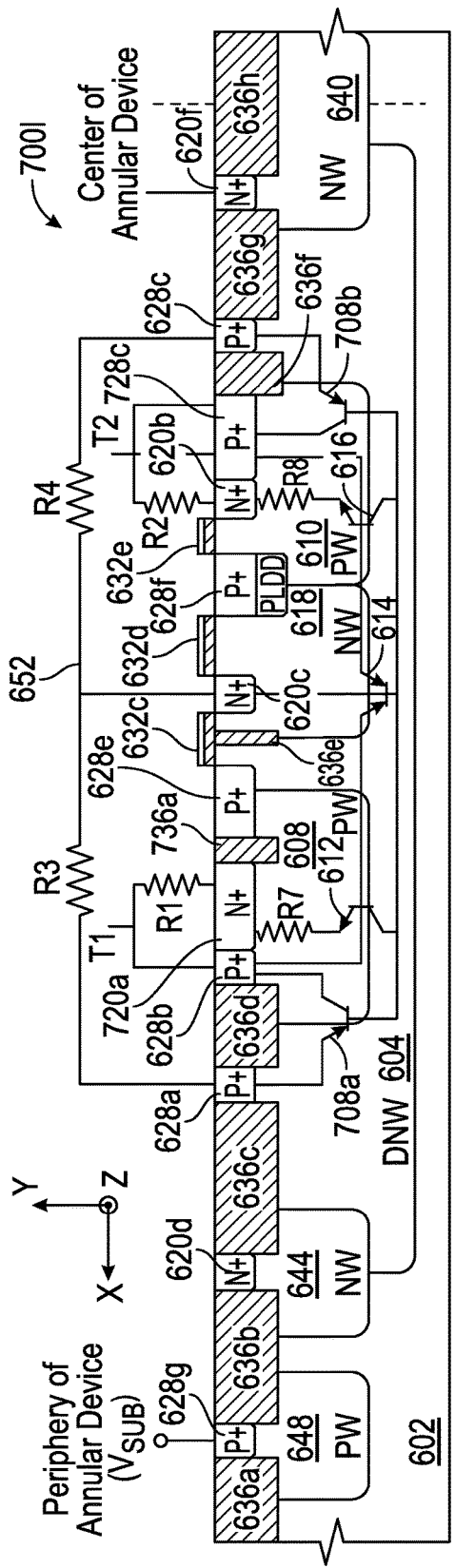

In the following, alternative embodiments are described with respect to FIGS. 7B-7L, in which descriptions of many features that similar to those described with respect to FIG. 7A are omitted.

Referring to FIG. 7B, the bidirectional protection device 700b is arranged similar to that of the bidirectional protection device 700a except, in place of the fourth n+ region 720b formed in the DNW 604, a first p+ region 628a is formed. As a result, a first triggering device comprising a first triggering PNP BJT 708a is formed in which the first p+ region 628a, the DNW 604 and the first PW 608 are configured as a emitter, a base and a collector. Similarly, in place of the fifth n+ region 720c formed in the DNW 604, a third p+ region 628c is formed, such that a second triggering device comprising a second triggering PNP BJT 708b is formed in which the third p+ region 628c, the DNW 604 and the second PW 610 are configured as an emitter, a base and a collector. By having the emitters of the first and second triggering PNP BJTs 708a and 708b that are electrically connected to the NPNPN bidirectional SCR through the first NW 618 to provide electrons thereto upon being activated, each pair of the NPNPN bidirectional SCR and the first and second triggering devices operates analogously to the bidirectional SCR 422 and the triggering device 404 described above with respect to FIG. 4A.

Referring to FIG. 7C, the bidirectional protection device 700c is arranged similar to that of the bidirectional protection device 700a of FIG. 7A except, in place of the tenth isolation region 736b, a fifth electrically floating metal layer 632e is formed. As described above, when an electrically floating metal layer is formed in lieu of a dielectric isolation region, comparable punch through and band-to-band tunneling performances can be achieved for adjacent highly doped regions, without incurring an increased carrier path length resulting from the physical dimensions of the dielectric isolation region. As a result, compared to that in the bidirectional protection device 700a of FIG. 7A, the second triggering NPN BJT 706b of the bidirectional protection device 700c can have relatively higher gain and/or faster speed.

Referring to FIG. 7D, the bidirectional protection device 700d is arranged similar to that of the bidirectional protection device 700b of FIG. 7B except, in place of the tenth isolation region 736b, a fifth electrically floating metal layer 632e is formed. As described above, when an electrically floating metal layer is formed in lieu of a dielectric isolation region, comparable punch through and band-to-band tunneling performances can be achieved for adjacent highly doped regions, without incurring an increased carrier path length resulting from the physical dimensions of the dielectric isolation region. As a result, compared to that in the bidirectional protection device 700b of FIG. 7B, the second triggering PNP BJT 708b of the bidirectional protection device 700c can have relatively higher gain and/or faster speed.

Referring to FIGS. 7E-7H, the bidirectional protection devices 700e, 700f, 700g and 700h are similar to the bidirectional devices 700a (FIG. 7A), 700b (FIG. 7B), 700c (FIG. 7C) and 700d (FIG. 7D), respectively, except, in each of the devices 700e-700g, an eleventh dielectric isolation region 736c is formed between the third n+ region 620c and the fifth p+ region 628f, in addition to the fourth electrically floating layer 632d. When implemented, the eleventh dielectric isolation region 736c can have an effect of, among other effects, a reduced gain and/or a reduction in speed due to an increase in the effective base length of the bidirectional PNP BJT 614, such that the triggering voltage of the bidirectional SCR under a positively biased T2 relative to the T1 can be increased in exchange for slower speed, among other effects. Alternatively, the eleventh dielectric isolation region 736*c* can be replaced by an electrically floating metal layer to allow for a faster conductivity modulation and faster activation under stress, as described above with respect to FIGS. 7A-7D.

Referring to FIGS. 7I-7L, the bidirectional protection devices 700*i*, 700*j*, 700*k* and 700*l* are similar to the bidirectional devices 700*a* (FIG. 7A), 700*b* (FIG. 7B), 700*c* (FIG. 7C) and 700*d* (FIG. 7D), respectively, except, in each of the devices 700*i*-700*l*, the first p+ region 728*a* is omitted. In addition a first n+ region 720*a* that is wider than the first n+ region 620*a* (FIGS. 7A-7D) by, e.g., 2×, 3× or 4×, are formed. When implanted, the wider first n+ region 720*a* increases the emitter injection area of the first NPN BJT 612, such that the current handling capability is increased.

Figure 8A:
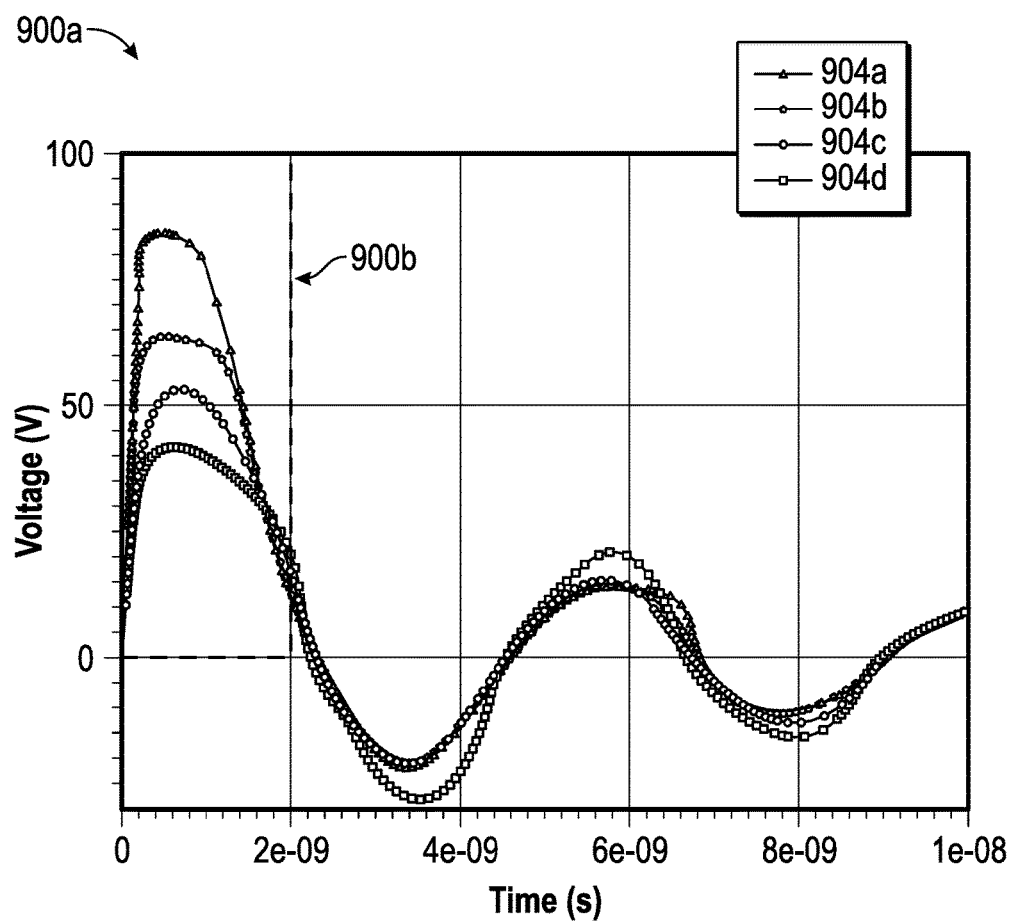
FIGS. 8A and 8B are graphs illustrating pulsed voltage-time curves based on simulations of bidirectional protection devices, according to embodiments illustrated in FIGS. 9A-9D.
Figure 8B:
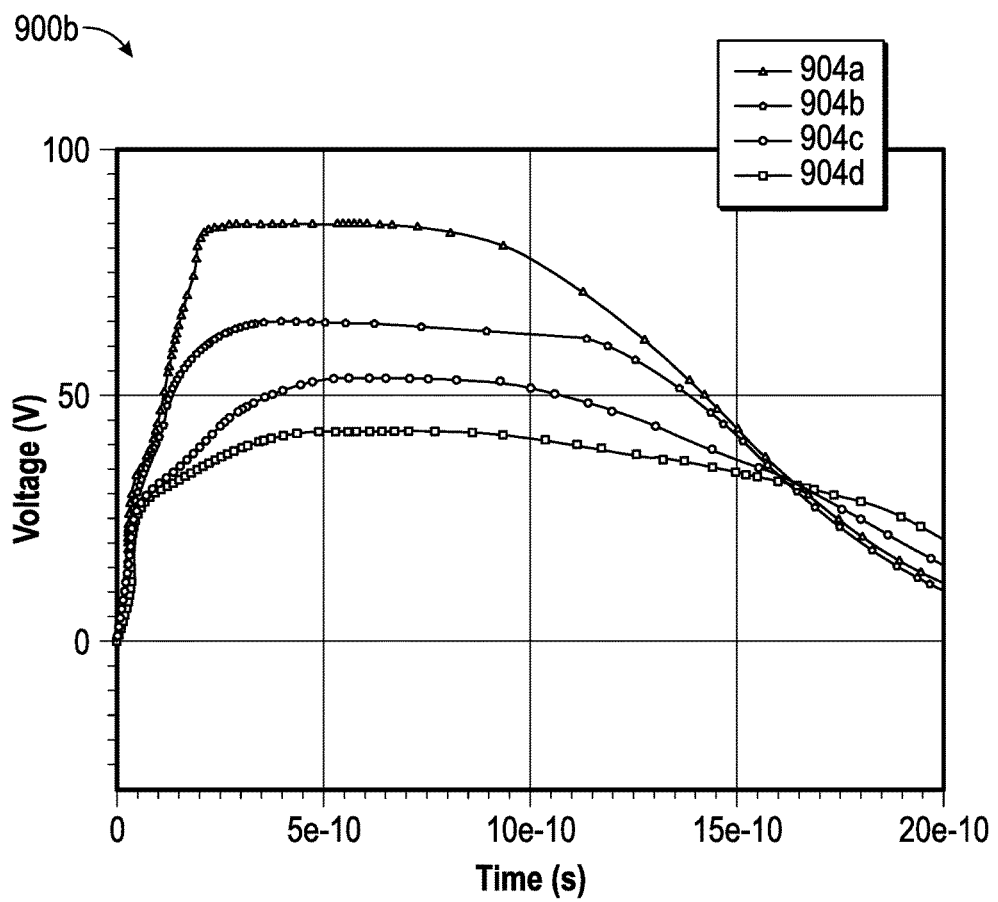

FIG. 8A is a graph 900*a* illustrating simulated device response curves (labeled with the corresponding bidirectional protection devices 904*a*-904*d*) of various bidirectional protection devices according to embodiments. The response curves were obtained by simulating on-chip stresses in accordance with a field-induced charged device model (FICDM), which is known to provide one of the fastest rise times available, e.g., in the sub-600 ps regime. The graph 900*b* of FIG. 8B is an expanded view of the graph 900*a* of FIG. 8A, expanded to show a time range between zero and 2 nanoseconds. The device response curves 904*a*, 904*b*, 904*c* and 904*d* correspond to bidirectional protection devices 904*a*, 904*b*, 904*c* and 904*d* illustrated in FIGS. 9A, 9B, 9C and 9D, respectively. Thus, in the following, device response curves graphed in FIGS. 8A/8B are discussed along with the corresponding bidirectional protection devices 904, 904*b* 904*c* and 904*d*. In FIGS. 8A/8B, The x-axis represents time and the y-axis represents the simulated voltage response of the various embodiments of the bidirectional protection devices.

It will be noted that the bidirectional protection devices 904*a*-904*d* represent successive improvements in terms of one of speed and/or voltage response, respectively, as manifested by the corresponding device response curves illustrated in FIGS. 8A/8B That is, the device response curves labeled 904*a*-904*d* illustrate successive improvements associated with corresponding structural improvements to the bidirectional protection devices 904*a*-904*d*, respectively. Thus, in the following, common features of 904*a*-904*d* are described first, followed by successive differences. It will be appreciated that a relatively lower first peak voltage in a device response curve of FIG. 8A/8B can correspond to a relatively faster response, as a lower first peak voltage can be caused by a correspondingly fast discharge.

Referring to FIGS. 9A-9D, each of the bidirectional protection devices 900*a*-900*d* include features that are similar to various embodiments described supra, e.g., FIGS. 6A/6B and 7A. For example, each of the bidirectional protection devices 900*a*-900*d* includes: a semiconductor substrate 602 having formed therein a first n-type well (NW) 618 interposed between a first p-type well (PW) 608 and a second p-type well (PW) 610; a third n-type well (NW) 640 formed at a side of the second PW 610 closer to the center of the device and having formed therein a sixth heavily doped n-type (n+) region 620*f*; a fourth n-type well (NW) 644 formed at a side of the first PW 612 facing away from the center of the device and having formed therein a fourth heavily doped n-type region (n+) 620*d*; a DNW 604 arranged as a tub-type isolation; and a third p-type well (PW) 648 formed at a side of the fourth NW 644 facing away from the center of the device and having formed therein a seventh heavily doped p-type (p+) region 628*g*. Each of the bidirectional protection devices 900*a*-900*d* has a fifth p+ region 628*e* formed at a boundary region between the first PW 608 and the DNW 604, and a sixth p+/PLDD region 628*f* formed at a boundary region between the first NW 618 and the second PW 610. Each of the bidirectional protection device 900*a*-900*d* also similarly has first to eighth dielectric isolation 636*a*-636*h* and third and fourth electrically floating metal layers 632*c* and 632*d*.

Referring to FIG. 9A, unlike the embodiment of FIG. 6A/6B, a triggering device, a resistor (e.g., the first resistor R1 in FIG. 6A) connected to the first n+ region 620*a*, and a resistor (e.g., the second resistor R2 in FIG. 6A) connected to the second n+ region 620*b* are omitted from the bidirectional protection device 900*a*. In addition, the first NW 618 and the second PW 610 are separated by a gap formed of the DNW 604. In addition, unlike the embodiment of FIG. 7B, the bidirectional protection device 900*a* additionally has a ninth dielectric isolation 736*a* and a tenth dielectric isolation 736*b* in lieu of electrically floating metal layers. As illustrated in graph 900*a* of FIGS. 8A/8B, the corresponding device response curve 900*a* shows a peak voltage that is relatively high (exceeding 80V).

The bidirectional protection device 900*b* of FIG. 9B is similar to the bidirectional protection device 900*a* of FIG. 9A except, in lieu of the ninth dielectric isolation 736*a* and the tenth dielectric isolation 736*b*, the bidirectional protection device 900*b* includes a second electrically floating metal layer 632*b* and a fifth electrically floating metal layer 632*e*, respectively. As discussed above, replacing a dielectric isolation with an electrically floating metal layer can result in an improved speed for the same lateral spacing between adjacent heavily doped regions, at least in part due to a reduced physical carrier path length. For instance, the current paths between the base of the first NPN transistor 612 and the collector/emitter (C/E) of the bidirectional PNP BJT 614, and between the base of the second NPN transistor 616 and the emitter/collector (E/C) of the bidirectional PNP BJT 614, are shortened relative to the corresponding current paths of the bidirectional protection device 904*a* of FIG. 9A. As illustrated in graph 900*a* of FIGS. 8A/8B, the corresponding device response curve 904*b* of shows a peak voltage that is lower (~65 V) compared to the device response curve 900*a*.

Figure 9C:
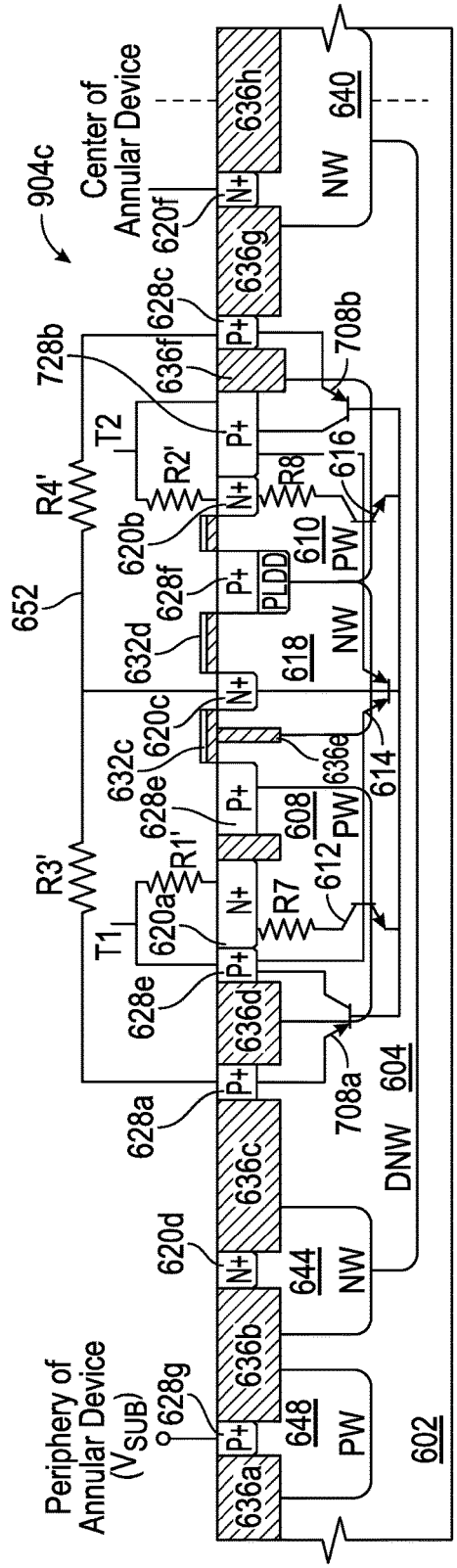
Figure 9D:
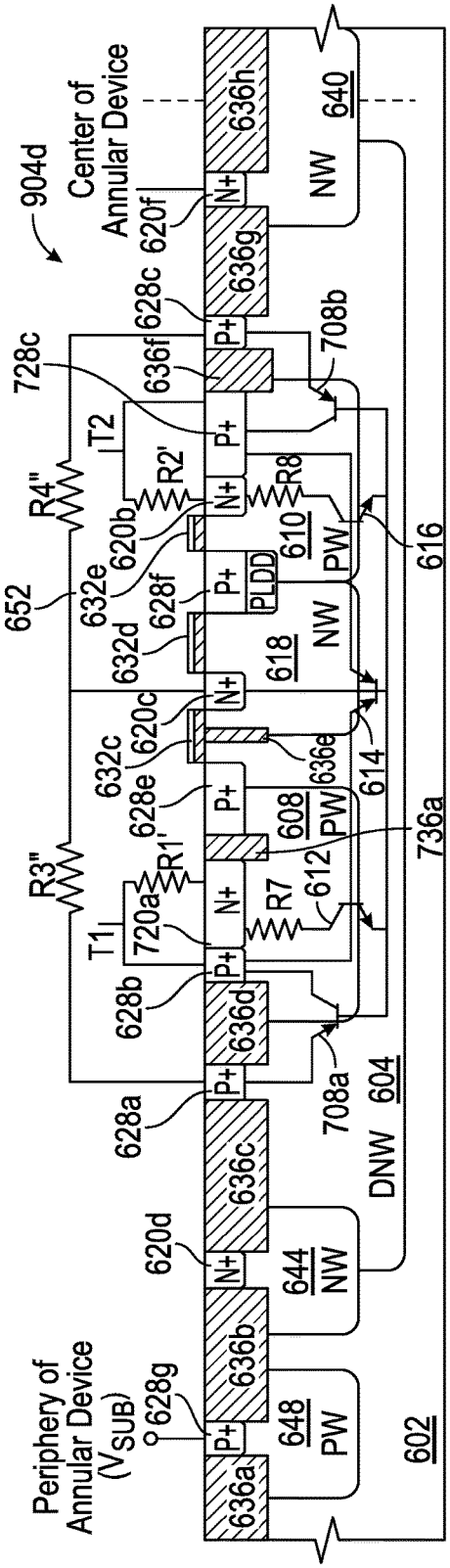
Figure 10A:
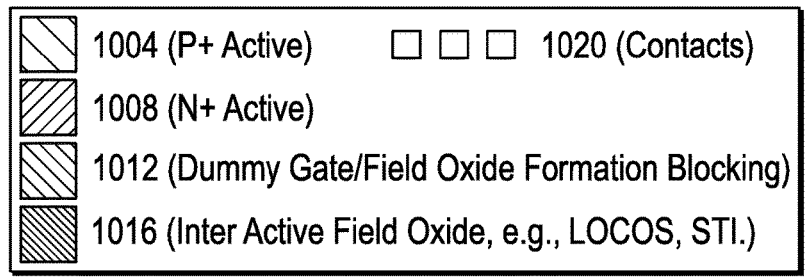
FIGS. 10A-10I schematically illustrate top-down layout views of adjoining heavily doped regions connected to terminals in various embodiments of bidirectional protection devices having a triggering device and a gain-controlled bidirectional SCR, according to embodiments.
Figure 10A:
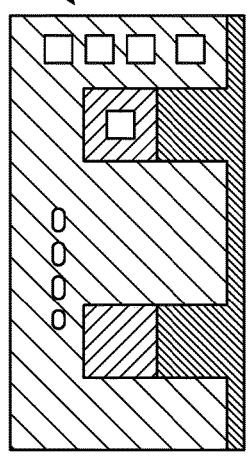
Figure 10B:
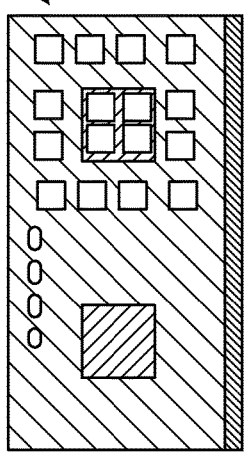
Figure 10C:
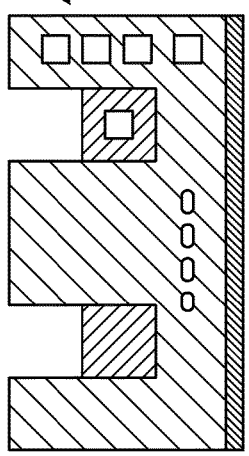
Figure 10D:
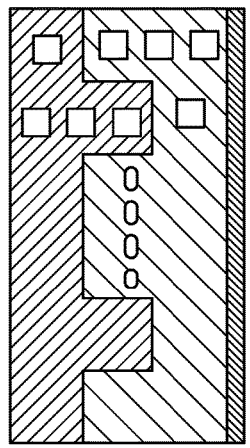
Figure 10E:
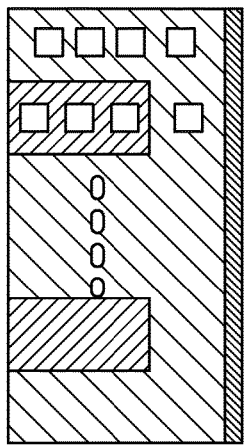
Figure 10F:
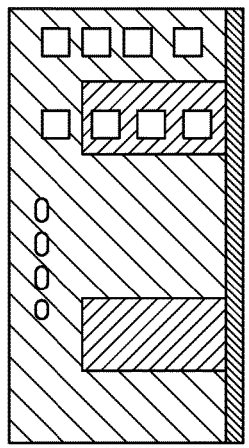
Figure 10G:
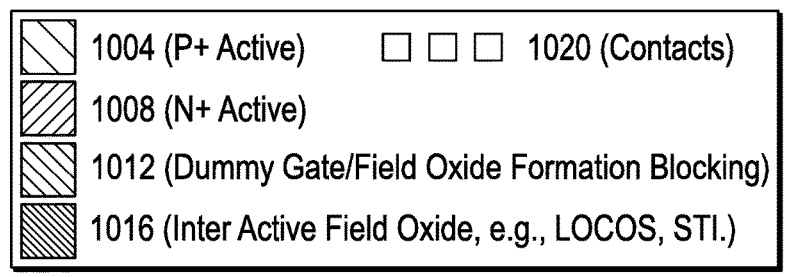
Figure 10G:
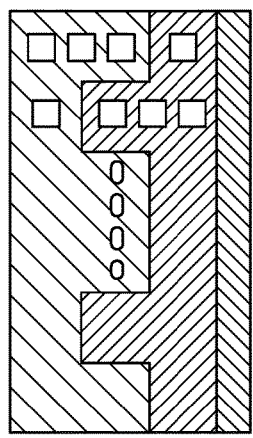
Figure 10H:
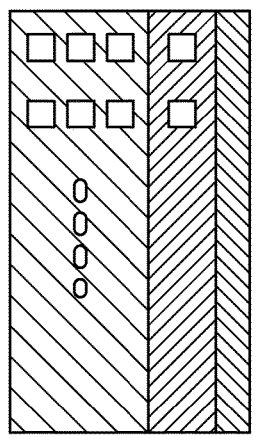
Figure 10I:
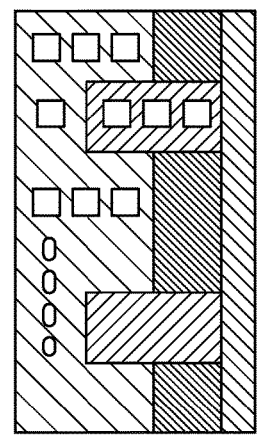

The bidirectional protection devices 904*c* of FIG. 9C and 904*d* of FIG. 9D, and their corresponding device response curves illustrate further improvements in device peak voltages, respectively, relative to the protection devices 900*a* and 900*b* of FIGS. 9A and 9B by including a first triggering device comprising a first PNP BJT 708*a* and a second triggering device comprising a second triggering device comprising a second PNP BJT 708*b* to accelerate the activation of the bidirectional SCR. Each of the bidirectional protection devices 904*c* and 904*d* is similar to the bidirectional protection device 700*l* of FIG. 7L and to each other. Thus, a detailed description of various components will be omitted. However, each of the protection devices 904*c* and 904*d* has particular values of first through fourth resistors (R1'-R4' in FIG. 9C and R1'-R2', R3"-R4" in FIG. 9D), such that their device response curves are optimized, as described below.

The bidirectional protection device 900*c* has RF and R2 that are formed above the substrate by patterning one or more metallization levels such that each has a resistance value between about 0.005 Ohm and about 0.05 Ohm or between about 0.01 Ohm and about 0.10 Ohm, with a nominal resistance value of 0.05 Ohms. In addition, the bidirectional protection device 900*c* has R3' and R3 formed above the substrate by patterning one or more levels 652, where each of R3' and R4' has a resistance value between about 1 Ohm and about 100 Ohms, or between about 5 Ohm and about 50 Ohms with a nominal resistance value of about 10 Ohms. As illustrated in the graph 900*a* of FIGS. 8A/8B, the corresponding device response curve 904*c* shows a peak voltage that is lower (~55 V) compared to the device response curves 900*a* and 900*b*.

The bidirectional protection device 900*d* is the same as the bidirectional protection device 900*c*, except that each of third and fourth resistors R3" and R4" has a resistance value between about 0.001 Ohm and about 0.1 Ohm or between about 0.005 Ohm and about 0.05 Ohm, with a nominal resistance value of about 0.01 Ohm. As illustrated in the graph 900*a* of FIGS. 8A/8B, the corresponding device response curve 904*d* shows a peak voltage that is lower (~40 V) compared to the device response curves 900*a*-900*c*.

FIGS. 10A-10I illustrate various plan-view layout views of abutting heavily doped (n+ and p+) regions 1000*a*-1000*i* that are connected to the T1 and/or T2 in various embodiments described above, including adjacent heavily doped regions of the bidirectional devices 600 of FIGS. 6A-6B, 700*a*-7*l* of FIGS. 7A-7L and 900*a*-900*d* of FIGS. 9A-9D.

In particular, each of the abutting n+ and p+ regions 1000*a*-1000*i* has one or more p+ regions 1004 having one or more contacts 1020 formed thereon and one or more p+ regions 1008 having one or more contacts 1020 formed thereon. Depending on the bidirectional device, the abutting n+ and p+ regions 1000*a*-1000*i* can include one or more of a dummy gate/field oxide region 1012 and an inter-active field oxide region 1016 for reasons described above.

The particular configuration of the abutting n+ and p+ regions 1000*a*-1000*i* depends on the resulting device parameter being optimized. For example, where a relatively high emitter injection is desired for the first NPN BJT 612 and/or the second NPN BJT 616, a relatively large n+ region may be desirable. Conversely, where a relatively high collector current for a PNP triggering BJT or a relatively high base current for an NPN triggering BJT is desired, a relatively large p+ region may be desirable.

Furthermore, the number and size of the contact regions 1020 formed on the n+ regions 1008 can directly influence the values of the first resistor R1 and/or second resistor R2. As discussed above, the resistance values of the R1 and R2 can have a direct impact on the holding voltage of various embodiments of the bidirectional protection devices disclosed herein.

Figure 11A:
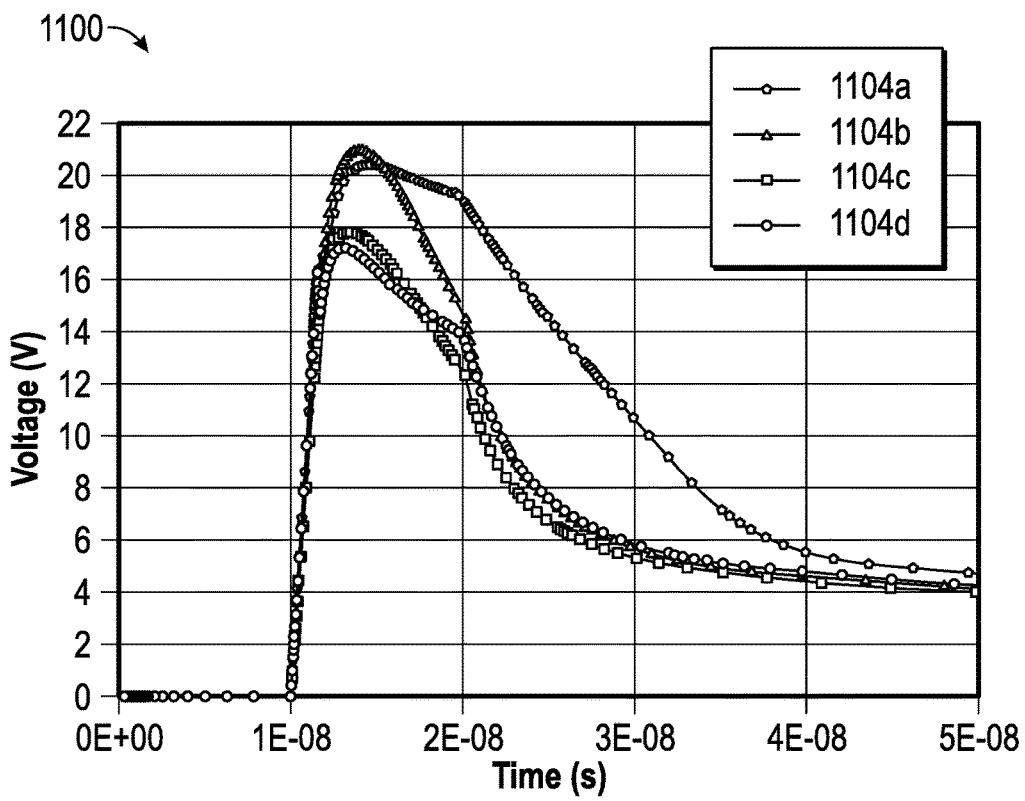
FIG. 11A is a graph of pulsed voltage-time curves based on simulations of bidirectional protection devices having a triggering device and a gain-controlled bidirectional SCR, according to embodiments illustrated in FIGS. 11B-11E.

FIG. 11A is a graph 1100 illustrating simulated device response curves of various embodiments, using FICDM, similar to the graph 900*a* of FIG. 8. In particular, device response curves 1104*a*-1104*d* correspond to bidirectional protection devices 1104*a*-1104*d* illustrated in FIGS. 11B-11E, respectively. In FIG. 11A, the x-axis represents time and the y-axis represents the simulated device voltages. The device response curves labeled 1104*a*-1104*d* illustrate successive improvements associated with corresponding structural improvements to the bidirectional protection devices 1104*a*-1104*d*, respectively. Thus, in the following, common features of 1104*a*-1104*d* are described first, followed by successive differences. It will be appreciated that, while each of the bidirectional protection devices 1104*a*-1104*d* does not illustrate a triggering device, described supra, connected to a respective bidirectional SCR, the features described can be practiced with or without a triggering device.

Figure 11B:
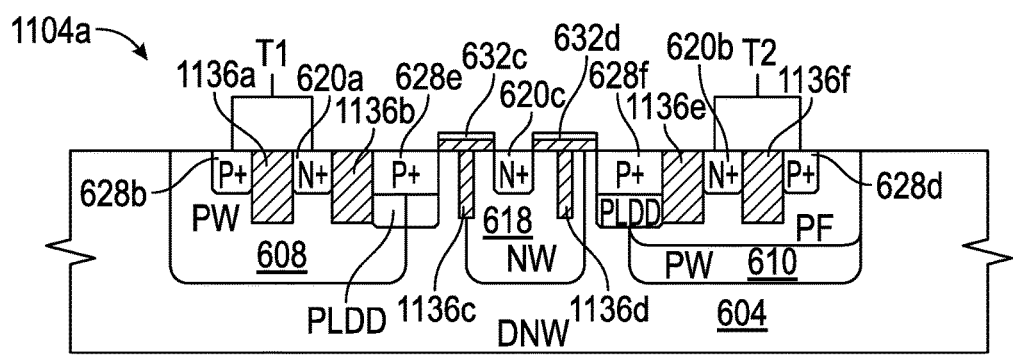
FIGS. 11B-11E schematically illustrate various embodiments of bidirectional protection devices having a triggering device and a gain-controlled bidirectional SCR, corresponding to pulsed current-voltage time curves illustrated in FIG. 11A.
Figure 11C:
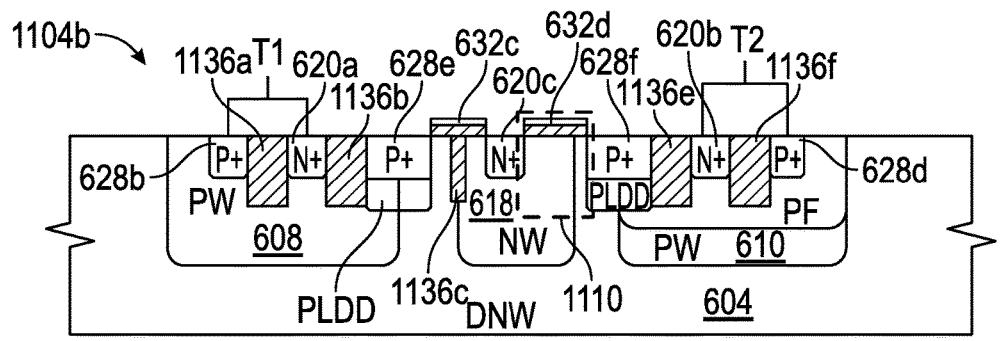
Figure 11D:
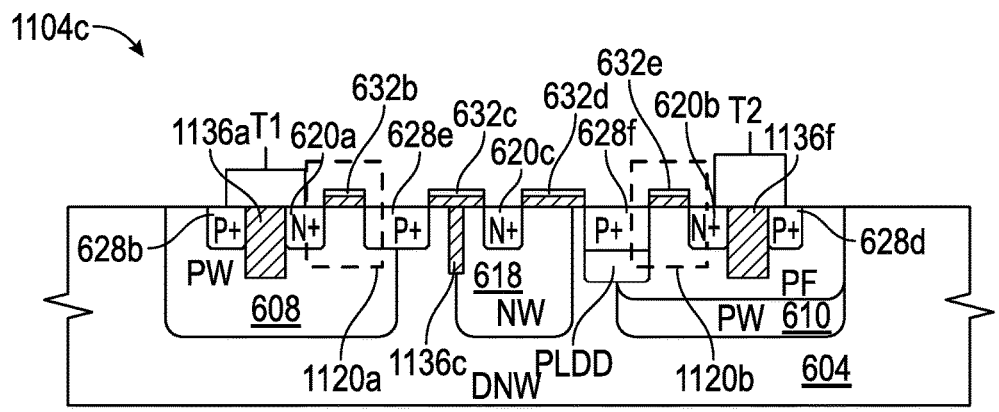
Figure 11E:
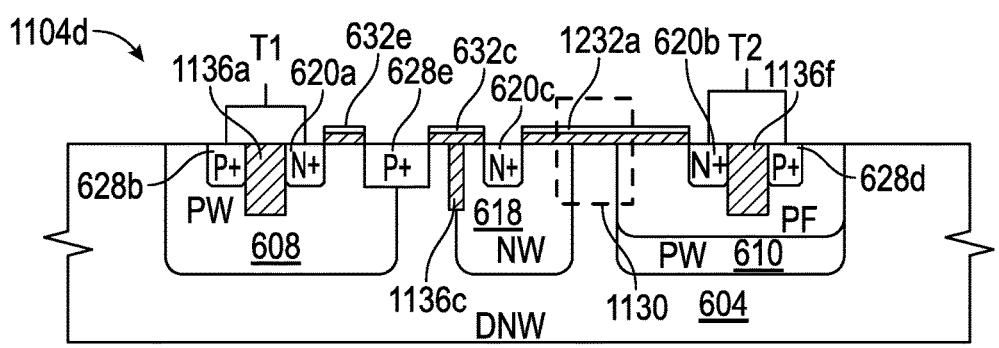

Referring to FIGS. 11B-11D, each of the bidirectional protection devices 1104*a*-1104*d* has a semiconductor substrate (not shown) having formed therein a NW 618 interposed between a first PW 608 and a second PW 610. A DNW 604 is arranged as a tub-type isolation laterally and vertically enclosing the first PW 608, the second PW 610 and the NW 618. The first PW 608 has formed therein a first n+ region 620*a* and second p+ region 628*b* each connected to T1, and a first isolation region 1136*a* interposed therebetween. The second PW 610 has formed therein a second n+ region 620*b* and a forth p+ region 628*d* each connected to T2, and a sixth isolation region 1136*f* interposed therebetween. The NW 618 has a third n+ region 620*c* formed therein. Each of the bidirectional protection devices 1104*a*-1104*d* additionally has a fifth p+/PLDD region 628*e*, a third isolation region 1136*c* and a third electrically floating metal layer 632*c* formed between the fifth p+/PLDD region 628*e* and the third n+ region 620*c*.

Referring to FIG. 11B, the bidirectional protection device additionally includes a sixth p+/PLDD region 628*f* formed at a junction between the DNW 604 and the second PW/PF 610, a second isolation region 1136*b* formed between the first n+ region 620*a* and the fifth p+/PLDD region 628*e*, a fifth isolation region 1136*e* formed between the second n+ region 620*b* and the fourth p+ region 628*d*, a fourth isolation region 1136*d* formed in the NW 618 and a fourth electrically floating layer 632*d* formed between the third n+ region 620*c* and the sixth p+/PLDD region 628*f*. As can be seen in graph 1100 of FIG. 11A, under a FICDM stress condition, the corresponding device response curve 1104*a* shows a peak voltage that is relatively high (exceeding 20V) and a relatively long duration, about 20 ns before the peak voltage drops to about half of the peak voltage.

Referring to FIG. 11C, the bidirectional protection device 1104*b* is the same as the bidirectional protection device 1104*a* (FIG. 11B), except that an isolation region is omitted between the third n+ region 620*c* and the fifth p+/PLDD region 628*f*. Referring to FIG. 11A, the corresponding device response curve 1104*b* shows a peak voltage that is relatively high (exceeding 20V) but having a relatively short duration (about 10 ns before the peak voltage drops to about half of the peak voltage) compared to the bidirectional protection 1104*a* (FIG. 11B), Referring to FIG. 11D, the bidirectional protection device 1104*c* is the same as the bidirectional protection device 1104*b* (FIG. 11C), except that the second isolation region 1136*b* between the first n+ region 620*a* and the fifth p+/PLDD region 628*e* is replaced with a second electrically floating layer 632*b*, and the fifth isolation region 1136*e* between the second n+ region 620*b* and the sixth p+/PLDD region 628*f* is replaced with a fifth electrically floating layer 632*e*. Referring to FIG. 11A, the corresponding device response curve 1104*c* shows a peak voltage that is relatively low (about 18V) and having a relatively short duration (about 10 ns before the peak voltage drops to about half of the peak voltage) compared to the bidirectional protection 1104*a* of FIG. 11B, Referring to FIG. 11E, the bidirectional protection device 1104*d* is the same as the bidirectional protection device 1104*c* (FIG. 11D), except that fifth p+/PLDD region 628*f* is omitted. In addition, a sixth electrically floating metal layer 1232*a* is extendedly formed between the third n+ region 620*c* and the second n+ region 620*b*. Referring to FIG. 11A, the corresponding device response curve 1104*d* shows a peak voltage that is relatively low (about 18V) and having a relatively short duration (about 10 ns before the peak voltage drops to about half of the peak voltage) compared to the bidirectional protection 1104a of FIG. 11B.

Figure 12A:
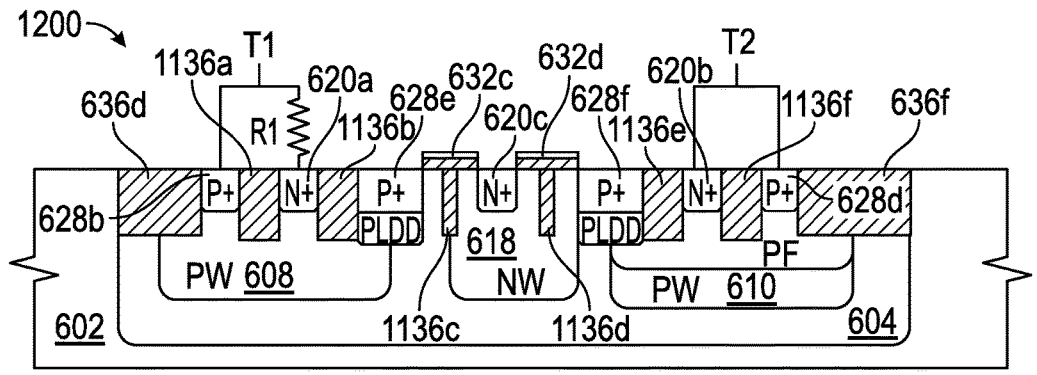
FIG. 12A schematically illustrates an embodiment of a bidirectional protection device having a triggering device and a gain-controlled bidirectional SCR under different configurations, corresponding to pulsed current-voltage time curves illustrated in FIG. 12B.
Figure 12B:
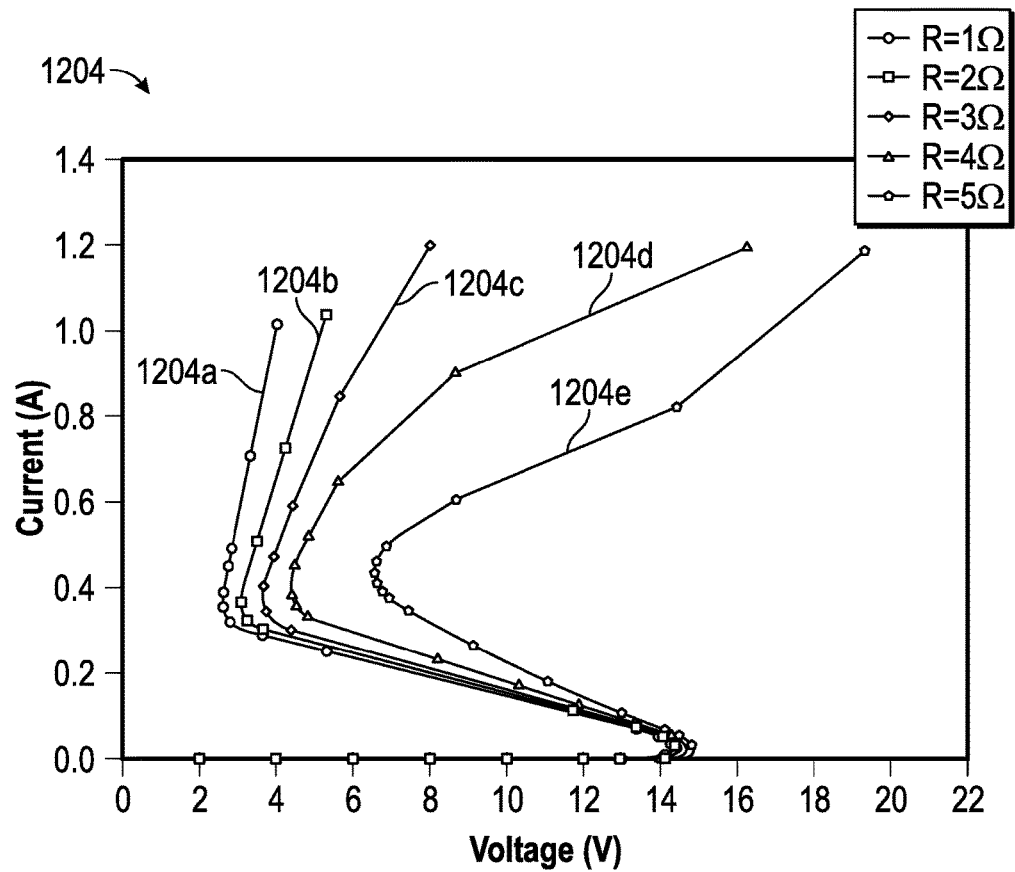
FIG. 12B is a graph of quasi-static current-voltage curves based on simulations of the bidirectional protection device according to the embodiment illustrated in FIG. 12A.

FIG. 12A illustrates a bidirectional protection device 1200 according to some embodiments and FIG. 12B is a graph 1204 illustrating the modulation of holding voltage by changing the value of the first resistor connected between T1 and the first n+ region, as described above. The bidirectional protection device 1200 is similar to the bidirectional protection device 1104a of FIG. 11B, except for the inclusion of a first resistor R1 between the T1 and the first n+ region 620a for illustrative purposes. As described above, the value of R1 is directly proportional to the holding voltage of the bidirectional BJT of the bidirectional protection device 1200. For instructive purposes, DC current-voltage (IV) curves corresponding to activation characteristics of the bidirectional BJT of the bidirectional protection device 1200 are plotted for different values of the R1. IV curves 1204a-1204e correspond to the bidirectional protection device 1200 having R1 with resistance values of 1 Ohm, 2 Ohms, 3 Ohms, 4 Ohms and 5 Ohms, respectively. As illustrated, while the resistance value of R1 has relatively negligible effect to the DC trigger voltage (~15V), it has a direct effect on the holding voltage. By increasing the resistance value from 1 Ohm to 5 Ohms, the DC holding voltage increases from about 2.5V to about 7V. It will be appreciated that, while the bidirectional protection device 1200 does not illustrate a triggering device, described supra, connected to a respective bidirectional SCR, the features described can be practiced with or without a triggering device.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An integrated circuit device, comprising:
a semiconductor substrate having formed therein a bidirectional semiconductor-controlled rectifier (SCR) having a cathode/anode (K/A) electrically connected to a first terminal (T1) and an anode/cathode (A/K) electrically connected to a second terminal (T2), wherein the bidirectional SCR comprises a first bipolar transistor, a second bipolar transistor, and a bidirectional bipolar transistor comprising a base coupled to a central region of the bidirectional SCR;
a plurality of metallization levels formed outside the semiconductor substrate; and
a triggering device formed in the semiconductor substrate on a first side and adjacent to the bidirectional SCR and comprising one or more of a bipolar junction transistor (BJT) or an avalanche PN diode, wherein a first device terminal of the triggering device is commonly connected to the T1 with the K/A, and wherein a second device terminal of the triggering device is electrically connected to the central region of the bidirectional SCR through one or more of the metallization levels.

2. The integrated circuit device of claim 1, wherein the bidirectional SCR is an NPNPN SCR comprising a first n-type well (NW) formed at the central region and interposed between a first p-type well (PW) and a second p-type well (PW), wherein the first PW has formed therein a first heavily doped n-type (n+) region serving as the K/A and the second PW has formed therein a second heavily doped n-type (n+) region serving as the A/K.

3. The integrated circuit device of claim 2, wherein the first n+ region is electrically connected to the T1 through a first resistor (R1) formed at one or more of the metallization levels of the integrated circuit device and formed of one or more of patterned polysilicon or patterned thin-film metal layers, the R1 having a resistance value between about 0.001 Ohms and about 20 Ohms.

4. The integrated circuit device of claim 2, wherein the second device terminal of the triggering device is electrically connected to the central region of the bidirectional SCR through a third heavily doped n-type (n+) region formed in the first NW and further through a third resistor (R3) formed at the one or more of the metallization levels and formed of one or more of a patterned polysilicon layers or a patterned thin-film metal layer, the R3 having a resistance between about 0.1 Ohm and about 2000 Ohms.

5. The integrated circuit device of claim 4, further comprising a second n-type well adjacent the first PW and having formed therein a first heavily doped p-type (p+) region, wherein the triggering device comprises a PNP BJT having the first p+ region, the second NW and the first PW configured as an emitter, a base and a collector, respectively, such that the collector of the PNP BJT and the K/A of the bidirectional SCR are commonly electrically connected to the T1, and such that the emitter of the PNP BJT is electrically connected to the first NW through the one or more of the metallization levels.

6. The integrated circuit device of claim 5, wherein the T1 is electrically connected to the first PW through a second heavily doped p-type (p+) region formed in the first PW, wherein an SCR current path length between the first n+ region and the second n+ region is longer than a trigger component current path length between the first p+ region and the second p+ region by a factor of at least four such that under a transmission line-pulsed (TLP) voltage condition in which the T1 is negatively biased relative to the T2, the PNP BJT is configured to trigger at a faster speed compared to the bidirectional SCR.

7. The integrated circuit device of claim 6, wherein the PNP BJT has a threshold voltage that is lower than a trigger voltage of the SCR under the TLP voltage condition such that the PNP BJT is activated prior to the bidirectional SCR.

8. The integrated circuit device of claim 6, further comprising a third heavily doped (p+) p-type region formed at least partially within the first PW and a fourth heavily doped (p+) region formed at least partially within the second PW.

9. The integrated circuit device of claim 8, further comprising a first metal oxide stack formed between the third p+ region and the third n+ region, and a second metal oxide stack formed between the third n+ region and the fourth p+ region.

10. The integrated circuit device of claim 9, further comprising a first dielectric isolation region formed in the semiconductor substrate and under at least one of the first and second metal oxide stacks.

11. The integrated circuit device of claim 4, wherein each of the first PW, the second PW and the first NW is formed within a deep N well (DNW) that forms an isolation tub enclosing each of the first PW, the second PW and the first NW.

12. The integrated circuit device of claim 11, further comprising a first heavily doped p-type (p+) region formed in the DNW, wherein the triggering device comprises a PNP BJT having the first p+ region, the DNW and the first PW configured as an emitter, base and a collector, respectively, such that the collector of the PNP BJT and the K/A of the bidirectional SCR are commonly electrically connected to the T1, and wherein the emitter of the PNP BJT is electrically connected to the first NW through the one or more of the metallization levels.

13. The integrated circuit device of claim 11, wherein the triggering device comprises an NPN BJT having the first n+ region, the first PW and the DNW configured as an emitter, base and a collector of the NPN BJT, respectively, wherein the base of the NPN BJT and the K/A of the bidirectional SCR are commonly electrically connected to the T1, and wherein the collector of the NPN BJT is electrically connected to the first NW through the one or more of the metallization levels.

14. The integrated circuit device of claim 11, further comprising a fourth heavily doped n-type (n+) region formed in the DNW on the first side of the SCR and a first heavily doped p-type (p+) region formed in the first PW, wherein the triggering device comprises an avalanche diode having a current path length between the fourth n+ region and the first p+ region less than 2 µm, such that when the T1 is negatively biased relative to the T2, the fourth n+ region, the DNW and the first p+ region are configured to serve an $n^+p$ avalanche diode.

15. The integrated circuit device of claim 1, wherein the metallization levels form part of a back-end processed potion of the integrated circuit device.

16. The integrated circuit device of claim 1, wherein a base of the first bipolar transistor is coupled a doped region serving as one of an emitter or a collector of the bidirectional bipolar transistor, and wherein a base of the second bipolar transistor is coupled to another doped region serving as the other of the emitter or the collector of the bidirectional bipolar transistor.

17. The integrated circuit device of claim 11, wherein the semiconductor substrate further has formed therein on a second side and adjacent to the bidirectional SCR a second triggering device comprising one or more of a BJT or an avalanche PN diode, wherein a first device terminal of the second triggering device is commonly connected to the T2 with the A/K of the bidirectional SCR, and wherein a second device terminal of the second triggering device is electrically connected to the central region of the bidirectional SCR through the one or more of the metallization levels.

18. An integrated circuit device, comprising:
a semiconductor substrate having formed therein an NPNPN bidirectional semiconductor-controlled rectifier (SCR) having a cathode/anode (K/A) electrically connected to a first terminal (T1) and an anode/cathode (A/K) electrically connected to a second terminal (T2), wherein the NPNPN bidirectional SCR comprises a first bipolar transistor, a second bipolar transistor, and a bidirectional bipolar transistor comprising a base coupled to a central region of the bidirectional SCR;
a plurality of metallization levels formed outside the semiconductor substrate; and
a triggering device formed in the semiconductor substrate on a first side of the NPNPN bidirectional SCR and comprising a bipolar junction transistor (BJT) or an avalanche diode, wherein a first device terminal of the triggering device is electrically connected to a central n-type region of the bidirectional SCR through one or more of the metallization levels.

19. The integrated circuit device of claim 18, wherein when the T1 is biased negatively relative to the T2, the bidirectional SCR is configured such that electrons flow from the T1 to the T2, and the triggering device is configured to supply electrons to the central n-type region of the bidirectional SCR such that the NPNPN bidirectional SCR is activated at a triggering voltage less than an intrinsic trigger voltage of the NPNPN bidirectional SCR without the triggering device electrically connected to the central n-type region.

20. The integrated circuit device of claim 18, wherein the bidirectional SCR comprises an n-type well (NW) interposed between a first p-type well (PW) and a second p-type well (PW), wherein the NW comprises the central n-type region, wherein the first PW has formed therein a heavily doped n-type (n+) region serving as the K/A and connected to the T1 through a first resistor (R1).

21. The integrated circuit device of claim 20, wherein the first PW has formed therein a heavily doped p-type (p+) region commonly connected to the T1 with the n+ region.

22. The integrated circuit device of claim 21, wherein the p+ region and the n+ region are separated by an electrically floating metal layer formed at one or more of the metallization levels.

23. The integrated circuit device of claim 21, wherein the p+ region and the n+ region contact each other.

24. The integrated circuit device of claim 21, wherein the first PW has formed therein another heavily doped p-type region commonly connected to the T1 with the p+ region and the n+ region.

25. The integrated circuit device of claim 21, wherein the p+ region and the n+ region are separated by a dielectric isolation region.

26. An integrated circuit device, comprising:
a semiconductor substrate having formed therein an NPNPN bidirectional semiconductor-controlled rectifier (SCR) having a cathode/anode (K/A) electrically connected to a first terminal (T1) and an anode/cathode (A/K) electrically connected to a second terminal (T2), wherein the NPNPN bidirectional SCR comprises a first bipolar transistor, a second bipolar transistor, and a bidirectional bipolar transistor comprising a base coupled to a central region of the bidirectional SCR; and
two or more triggering devices formed in the semiconductor substrate adjacent to the NPNPN bidirectional SCR, wherein each triggering device comprises one of a bipolar junction transistor (BJT) or an avalanche diode, wherein first device terminals of the two or more triggering devices are electrically connected to a central n-type region of the bidirectional SCR, and are electrically connected to each other through one or more metallization levels of the integrated circuit device formed outside the semiconductor substrate.

27. The integrated circuit device of claim 26, wherein the NPNPN SCR comprises a first n-type well (NW) interposed between a first p-type well (PW) and a second p-type well (PW), wherein the first NW comprises the central n-type region, wherein the first PW has formed therein a first heavily doped n-type (n+) region serving as the K/A and the second PW has formed therein a second heavily doped n-type (n+) region serving as the A/K.

28. The integrated circuit device of claim 27, wherein the first PW is spaced apart from the NW while the second PW is contacted with the NW.

29. The integrated circuit device of claim 28, further comprising a first heavily doped p-type (p+) region formed partially in the first PW and a second heavily doped p-type (p+) region formed partially in the second PW.

30. The integrated circuit device of claim 29, further comprising a third heavily doped n-type (n+) region in the first NW, wherein a first electrically floating metal layer is formed at a first gap between the n+ region and the first p+ region, and wherein a second electrically floating metal layer is formed at a second gap between the n+ region and the second p+ region.

31. The integrated circuit device of claim 30, wherein a dielectric isolation is formed in the semiconductor substrate at one but not the other of the first gap and the second gap.

32. The integrated circuit device of claim 30, wherein a dielectric isolation is formed in the semiconductor substrate at each of the first gap and the second gap.

* * * * *

UNITED STATES PATENT AND TRADEMARK OFFICE
CERTIFICATE OF CORRECTION

PATENT NO. : 9,831,233 B2  
APPLICATION NO. : 15/142453  
DATED : November 28, 2017  
INVENTOR(S) : Javier Alejandro Salcedo et al.

Page 1 of 1

It is certified that error appears in the above-identified patent and that said Letters Patent is hereby corrected as shown below:

On the Title Page

In Column 2 (page 3, item (56)) at Line 25, Under Other Publications, change "(ICMTMS)," to --(ICMTS),--.

In the Specification

In Column 4 at Line 28, After "protected" insert --.--.

In Column 21 at Line 56, Change "7a-7l" to --700a-700l--.

In Column 21 at Line 60, Change "7a-7l" to --700a-700l--.

In Column 25 at Line 37, Change "The" to --the--.

In Column 26 at Line 66, Change "RF" to --R1'--.

In the Claims

In Column 31 at Line 37, In Claim 16, after "coupled" insert --to--.

Signed and Sealed this  
Third Day of July, 2018

Andrei Iancu  
*Director of the United States Patent and Trademark Office*